United States Patent
Nakata

(10) Patent No.: US 10,805,560 B2
(45) Date of Patent: Oct. 13, 2020

(54) SOLID-STATE IMAGING DEVICE AND ELECTRONIC APPARATUS

(71) Applicant: Sony Semiconductor Solutions Corporation, Kanagawa (JP)

(72) Inventor: Masashi Nakata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/576,057

(22) PCT Filed: Sep. 5, 2016

(86) PCT No.: PCT/JP2016/004041
§ 371 (c)(1),
(2) Date: Nov. 21, 2017

(87) PCT Pub. No.: WO2017/047039
PCT Pub. Date: Mar. 23, 2017

(65) Prior Publication Data
US 2018/0160058 A1    Jun. 7, 2018

(30) Foreign Application Priority Data
Sep. 18, 2015   (JP) ................... 2015-184760

(51) Int. Cl.
*H04N 5/357*    (2011.01)
*H01L 27/146*   (2006.01)
(Continued)

(52) U.S. Cl.
CPC ..... *H04N 5/3572* (2013.01); *H01L 27/14605* (2013.01); *H01L 27/14607* (2013.01);
(Continued)

(58) Field of Classification Search
CPC .... H04N 5/3572; H04N 5/3696; H04N 9/045; H01L 27/14605; H01L 27/14607;
(Continued)

(56) References Cited

U.S. PATENT DOCUMENTS

2004/0196563 A1   10/2004  Natori
2010/0207225 A1    8/2010  Masuda
(Continued)

FOREIGN PATENT DOCUMENTS

EP    2 980 850 A1    2/2016
JP    07-050401 A     2/1995
(Continued)

OTHER PUBLICATIONS

International Search Report and Written Opinion dated Jan. 25, 2017 in connection with International Application No. PCT/JP2016/004041.
(Continued)

*Primary Examiner* — Twyler L Haskins
*Assistant Examiner* — Fayez Bhuiyan
(74) *Attorney, Agent, or Firm* — Wolf, Greenfield & Sacks, P.C.

(57) ABSTRACT

Image quality can be improved. In a case where light is focused on the center of an opening, sensitivity can be decreased by extending any side of a light-shielding film to the center. Namely, in the case of adjusting the sensitivity to be decreased, there is no need to simultaneously change all the sides, but the adjusting may be achieved by moving only a specific side. Further, since each side is regarded as individual adjusting parameter, a complicated inside-angle-of-view distribution can be corrected. The present disclosure can be applied to, for example, a CMOS solid-state imaging device to be used in an imaging device such as a camera.

36 Claims, 24 Drawing Sheets

(51) Int. Cl.
*H04N 5/369* (2011.01)
*H04N 9/04* (2006.01)

(52) U.S. Cl.
CPC .. *H01L 27/14621* (2013.01); *H01L 27/14623* (2013.01); *H01L 27/14627* (2013.01); *H04N 5/3696* (2013.01); *H04N 9/045* (2013.01)

(58) Field of Classification Search
CPC ......... H01L 27/14621; H01L 27/14623; H01L 27/14627
See application file for complete search history.

(56) References Cited

U.S. PATENT DOCUMENTS

| | | | |
|---|---|---|---|
| 2012/0249846 A1* | 10/2012 | Nishio | H01L 27/14603 348/294 |
| 2012/0300104 A1 | 11/2012 | Onuki et al. | |
| 2015/0195466 A1 | 7/2015 | Takase et al. | |

FOREIGN PATENT DOCUMENTS

| | | |
|---|---|---|
| JP | 2000-036587 A | 2/2000 |
| JP | 2005-116939 A | 4/2005 |
| JP | 2012-169673 A | 9/2012 |
| JP | 5262823 B2 | 5/2013 |
| JP | 5515606 B2 | 4/2014 |
| JP | 2014-165270 A | 9/2014 |
| JP | 2015-015295 A | 1/2015 |
| JP | 2015-133469 A | 7/2015 |
| WO | WO 2013/080872 A1 | 6/2013 |
| WO | WO 2014/156659 A1 | 10/2014 |

OTHER PUBLICATIONS

Japanese Office Action dated Aug. 27, 2019 in connection with Japanese Application No. 2015-184760, and English translation thereof.

Japanese Office Action dated Mar. 31, 2020 in connection with Japanese Application No. 2015-184760 and English translation thereof.

* cited by examiner

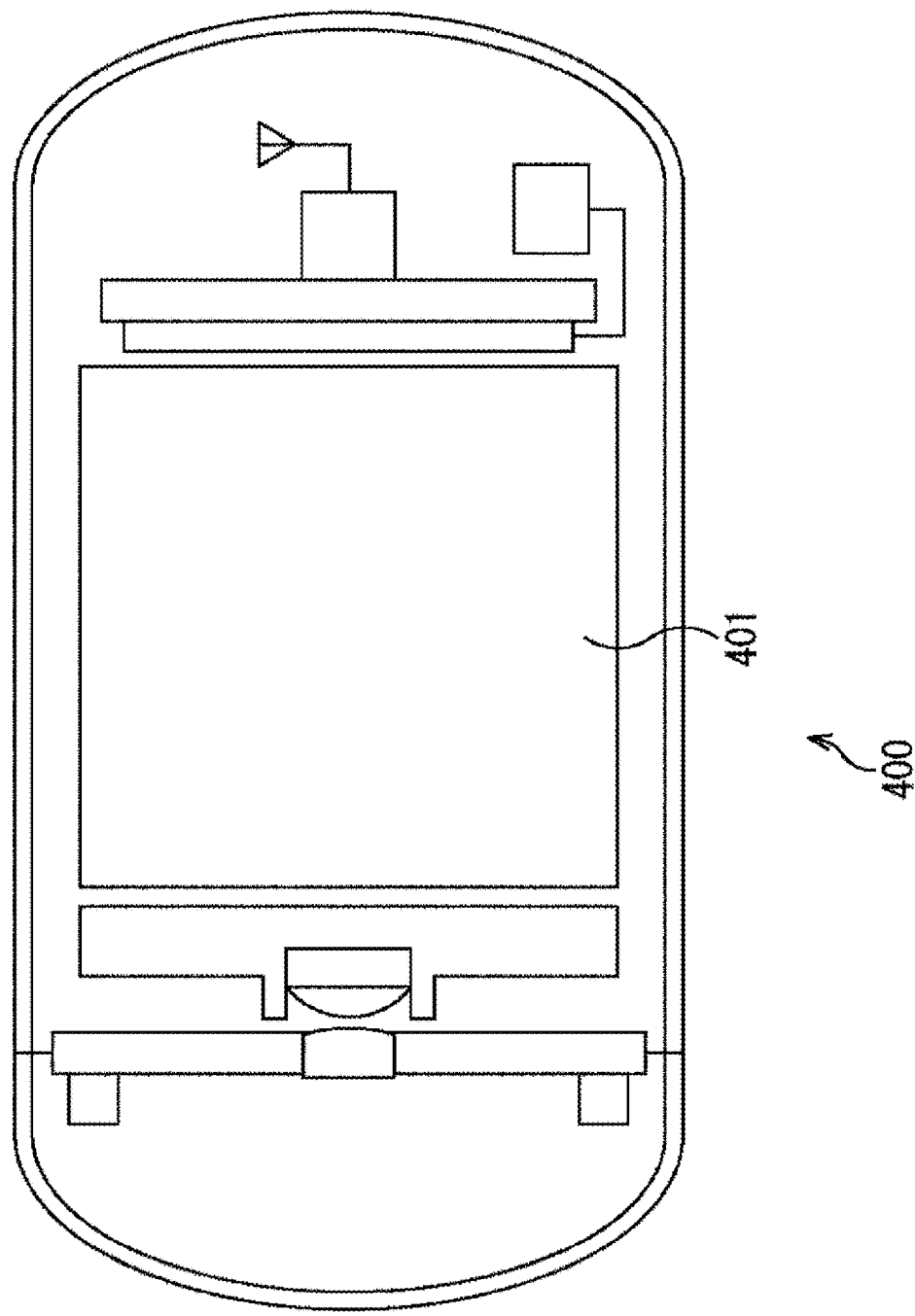

SOLID-STATE IMAGING DEVICE AND ELECTRONIC APPARATUS

CROSS REFERENCE TO RELATED APPLICATIONS

This application claims the benefit under 35 U.S.C. § 371 as a U.S. National Stage Entry of International Application No. PCT/US2016/004041, filed in the U.S. Patent and Trademark Office as a Receiving Office on Sep. 5, 2016, which claims priority to Japanese Priority Patent Application JP 2015-184760 filed on Sep. 18, 2015, the entire contents of each of which is incorporated herein by reference.

TECHNICAL FIELD

The present disclosure relates to a solid-state imaging device and an electronic apparatus, and more particularly, to a solid-state imaging device and an electronic apparatus capable of improving image quality.

BACKGROUND ART

With miniaturization of pixels, there is a case where a color ratio such as R/G or B/G or a sensitivity ratio of similar colors such as green (hereinafter, referred to as Gr) next to red or green (hereinafter, referred to as Gb) next to blue is different according to an image height within an angle of view.

In order to cope with this phenomenon, PTL 1 discloses adjusting exit pupil correction amount for every color, and PTL 2 discloses reducing optical eclipse by adjusting layout positions for every color. However, by merely using a method of maximizing the sensitivity, it is difficult to prevent unbalance of the sensitivity ratios according to the image height of miniaturized pixels.

Therefore, PTL 3 discloses a method of adjusting an aperture ratio or an exit pupil correction amount according to color or image height.

CITATION LIST

Patent Literature

PTL 1: JP 2012-169673 A
PTL 2: JP 5515606 B2
PTL 3: JP 5262823 B2

SUMMARY OF INVENTION

Technical Problem

According to the disclosure of PTL 3, adjusting of sensitivities can be performed according to the image height. However, in the disclosure of PTL 3, when a complicated in-screen distribution intends to be corrected, layout design has a high degree of difficulty.

The present disclosure is to improve image quality.

Solution to Problem

A solid-state imaging device of an aspect of the present technology is a solid-state imaging device having a pixel in an imaging area having a pixel array, including: a photoelectric conversion member which performs photoelectric conversion; a light-reducing member which is formed in an upper layer from the photoelectric conversion member to perform light reducing or light shielding; and an opening which is formed in the light-reducing member and of which a ratio of lengths of sides and a shape are different according to an image height.

The opening is configured with at least two or more sides.

The number of sides constituting the opening is different according to the image height.

The shape of the opening and an aperture ratio of the opening are changed according to the image height.

The aperture ratio of the opening is maintained, and only the shape of the opening is changed according to the image height.

The shape is changed into a non-linear shape.

The ratio of lengths of sides is adjusted for every pixel.

The ratio of lengths of sides is adjusted for every color of color filters of adjacent pixels adjacent to the pixel.

The solid-state imaging device further includes an on-chip lens in an upper layer from the light-reducing member, and the light-reducing member is installed between the on-chip lens and the photoelectric conversion member.

The on-chip lenses are formed so as to correspond to a plurality of the photoelectric conversion members.

The light-reducing member can perform the light reducing by using a metal film.

The light-reducing member can perform a combination of light reducing by using a metal film and light reducing by using covering with color filters.

The photoelectric conversion member is configured with a photodiode or an organic photoelectric conversion film.

The pixel array is a pixel array where two or more pixels of color filters for the same color or organic photoelectric conversion films are consecutively arranged, and in the pixels having the color filters for the same color, the ratio of lengths of sides and the shape of the opening are different according to the image height due to a difference of structures of the adjacent pixels.

The pixel array is a pixel array where a pixel for image-plane phase difference detection of which left or right side is light-shielded is included, and in surrounding pixels of the image-plane phase difference detection pixel, the ratio of lengths of sides and the shape of the opening are different according to the image height.

An electronic apparatus of an aspect of the present technology includes: a solid-state imaging device having a pixel in an imaging area having a pixel array, including: a photoelectric conversion member which performs photoelectric conversion; a light-reducing member which is formed in an upper layer from the photoelectric conversion member to perform light reducing or light shielding; and an opening which is formed in the light-reducing member and of which a ratio of lengths of sides and a shape are different according to an image height; a signal processing circuit which processes an output signal output from the solid-state imaging device; and an optical system which allows incident light to be incident on the solid-state imaging device.

According to an aspect of the present technology, there is provided a pixel in an imaging area having a pixel array, wherein an opening is formed in a light-reducing member which is formed in an upper layer from a photoelectric conversion member performing photoelectric conversion and performs light reducing or light-shielding, and a ratio of lengths of sides of the opening and a shape of the opening are different according to an image height.

Advantageous Effects of Invention

According to an embodiment of the present technology, it is possible to improve image quality.

In addition, since the effects disclosed in this specification are exemplary ones, the effects of the present technology are not limited to the effects disclosed in this specification, but additional effects may be obtained.

BRIEF DESCRIPTION OF DRAWINGS

FIG. 24 is a diagram illustrating a configuration example of a capsule endoscope according an embodiment of the present technology.

DESCRIPTION OF EMBODIMENTS

Hereinafter, aspects (hereinafter, referred to embodiments) for embodying the present disclosure will be described. In addition, the description will be made in the following order.

1. First Embodiment
2. Second Embodiment (Example of Application of the Present Technology)
3. Third Embodiment (Example of Use of Image Sensor)
4. Fourth Embodiment (Example of Electronic Apparatus)

1. First Embodiment

<Schematic Configuration Example of Solid-State Imaging Device>

Figure 1:
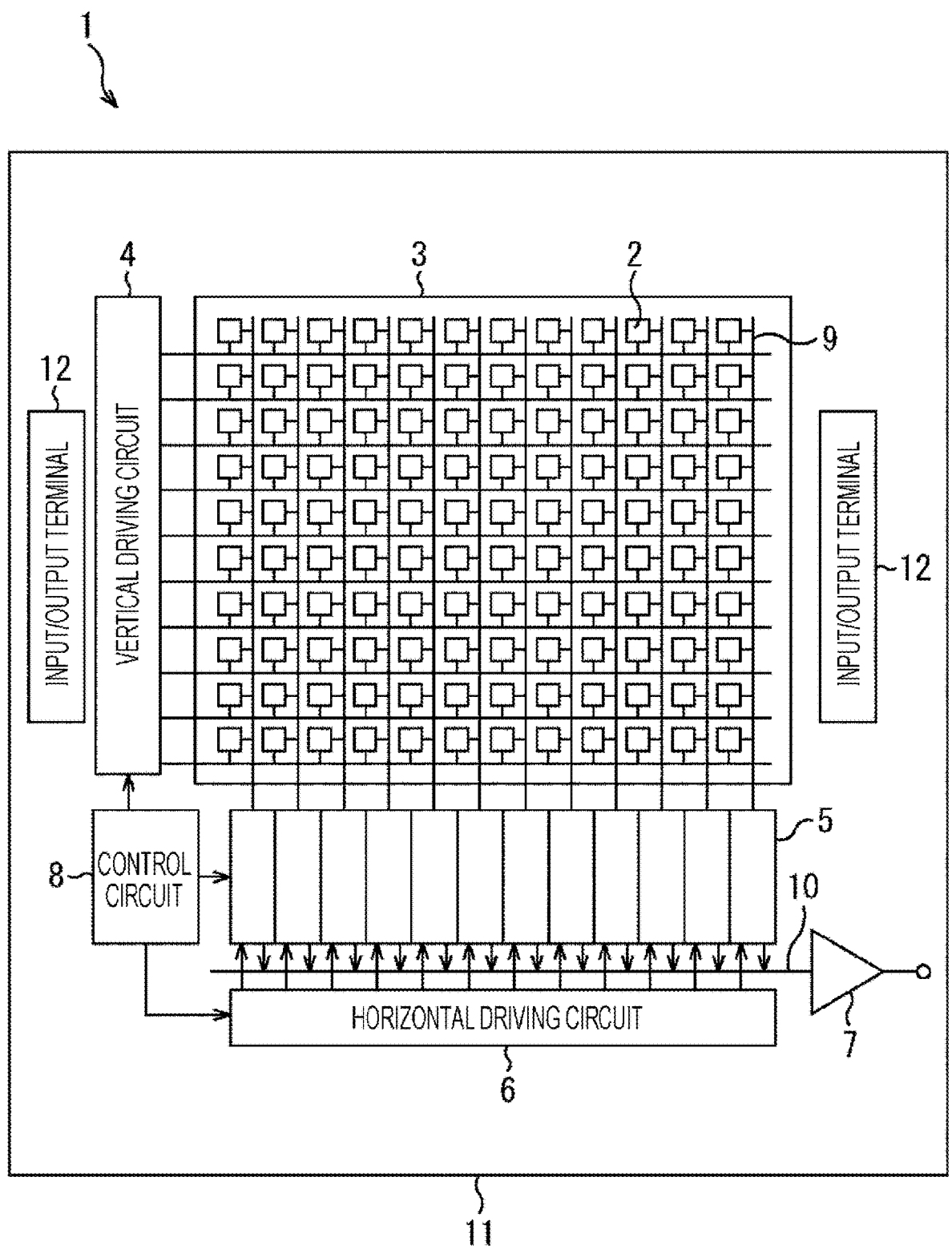
FIG. 1 is a block diagram illustrating a schematic configuration example of a solid-state imaging device according to an embodiment of the present technology.

FIG. 1 illustrates a schematic configuration example of an example of a Complementary Metal Oxide Semiconductor (CMOS) solid-state imaging device applied to embodiments of the present technology.

As illustrated in FIG. 1, a solid-state imaging device (device chip) 1 is configured to include a pixel area (so-called imaging area) 3 where pixels 2 including a plurality of photoelectric conversion elements are arranged regularly and two-dimensionally on a semiconductor substrate 11 (for example, silicon substrate) and a peripheral circuit area.

A pixel 2 is configured to include a photoelectric conversion element (for example, photodiode (PD)) and a plurality of pixel transistors (so-called MOS transistors). The plurality of pixel transistors may be configured with, for example, three transistors of a transfer transistor, a reset transistor, and an amplification transistor. Furthermore, by adding a selection transistor, the plurality of pixel transistors may also be configured with four transistors.

In addition, the pixels 2 may be configured in a pixel sharing structure. The pixel sharing structure is configured with a plurality of photodiodes, a plurality of transfer transistors, one shared floating diffusion, and one different shared pixel transistor. The photodiode is a photoelectric conversion element.

The peripheral circuit area is configured to include a vertical driving circuit 4, column signal processing circuits 5, a horizontal driving circuit 6, an output circuit 7, and a control circuit 8.

The control circuit 8 receives input clock or data commanding an operation mode or the like and outputs data such as internal information of the solid-state imaging device 1. More specifically, the control circuit 8 generates a clock signal or a control signal used as a reference of operations of the vertical driving circuit 4, the column signal processing circuits 5, and the horizontal driving circuit 6 based on a vertical synchronization signal, a horizontal synchronization signal, and master clock. The control circuit 8 inputs these signals to the vertical driving circuit 4, the column signal processing circuits 5, and the horizontal driving circuit 6.

The vertical driving circuit 4 is configured with, for example, shift registers to select a pixel driving line, to supply a pulse for driving the pixels 2 to the selected pixel driving line, and to drive the pixels 2 in units of a row. More specifically, the vertical driving circuit 4 selectively scans pixels 2 of the pixel area 3 in units of a row sequentially in the vertical direction and supplies a pixel signal based on signal charges generated according to a received light amount in a photoelectric conversion element of each pixel 2 to the column signal processing circuits 5 through a vertical signal line 9.

The column signal processing circuits 5 are disposed, for example, for the respective columns of the pixels 2 to perform signal processes such as noise removal on signals output from the pixels 2 of one row for the respective pixel columns. More specifically, the column signal processing circuits 5 perform signal processes such as Correlated Double Sampling (CDS) for removing fixed pattern noise unique to the pixels 2, signal amplification, and Analog/Digital (A/D) conversion. A horizontal selection switch (not illustrated) is installed to be connected to output stages of the column signal processing circuits 5 between the column signal processing circuits and the horizontal signal line 10.

The horizontal driving circuit 6 is configured with, for example, shift registers. The horizontal driving circuit sequentially outputs horizontal scan pulses to sequentially select the respective column signal processing circuits 5 and allows the respective column signal processing circuits 5 to output pixel signals to the horizontal signal line 10.

The output circuit 7 performs signal processes on signals sequentially supplied from the respective column signal processing circuits 5 through the horizontal signal line 10 and outputs the processed signals. In some cases, the output circuit 7 may perform, for example, only buffering. In other cases, the output circuit may perform black level adjusting, column variation correction, or various digital signal processes.

Input/output terminals 12 are installed to exchange signals with the outside.

<Example of Distribution of Gr/Gb Ratios>

Figure 2:
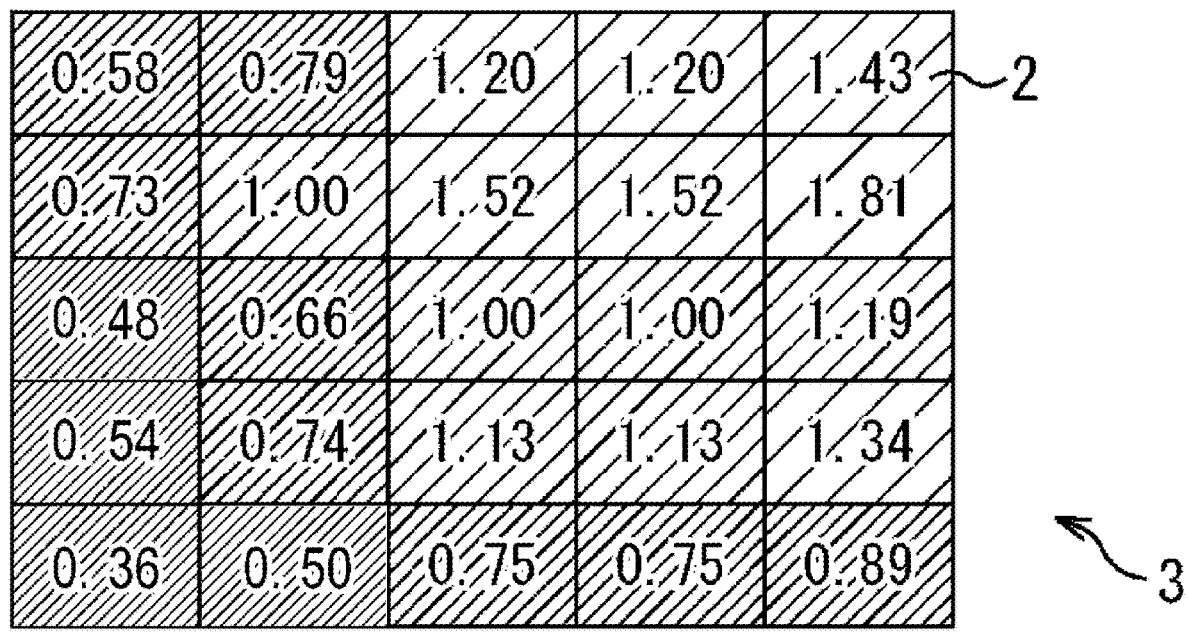
FIG. 2 is a diagram illustrating an example of distribution of Gr/Gb ratios in an imaging area.

FIG. 2 illustrates an example of distribution of Gr/Gb ratios in the imaging area 3. In addition, Gr denotes a green pixel next to a red pixel, and Gb denotes a green pixel next to a blue pixel.

In the present technology, while sides of a light-shielding/light-reducing film (hereinafter, simply referred to as a light-shielding film, but it also including a light-reducing film) forming an opening are regarded as individual adjusting parameters, a distribution of complicated sensitivities in the imaging area 3 is corrected. For example, a distribution having Gr/Gb balance illustrated in FIG. 2 is considered. In the example of FIG. 2, Gr/Gb ratios of the pixels 2 in the imaging area 3 are expressed by numeric values and hatching.

Figure 3:
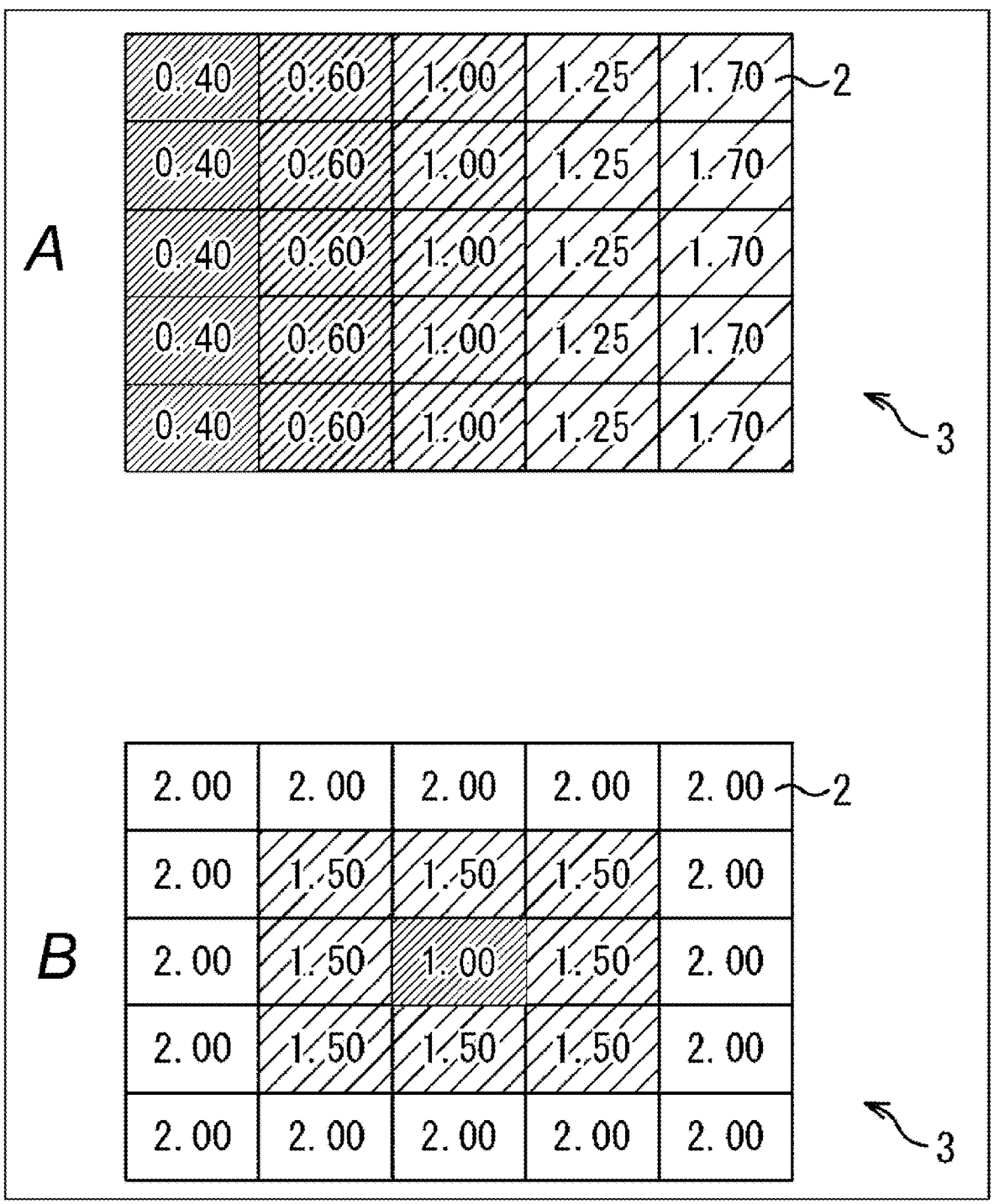
FIG. 3 is a diagram illustrating an example of distribution of Gr/Gb ratios in an imaging area.

This distribution is hard to express with a simple mathematical formula according to an image height, and layout design using a mathematical formula has a high degree of difficulty. In addition, on the contrary, the simple distribution denotes a distribution where the value varies in a monotonically increasing or decreasing manner to the left or right side as illustrated in FIG. 3A, a distribution where the value varies in a monotonically increasing or decreasing manner to the upper or lower side as not illustrated in the figure, or a distribution where the value varies in a monotonically increasing or decreasing manner to the concentric circles as illustrated in FIG. 3B.

Figure 4:
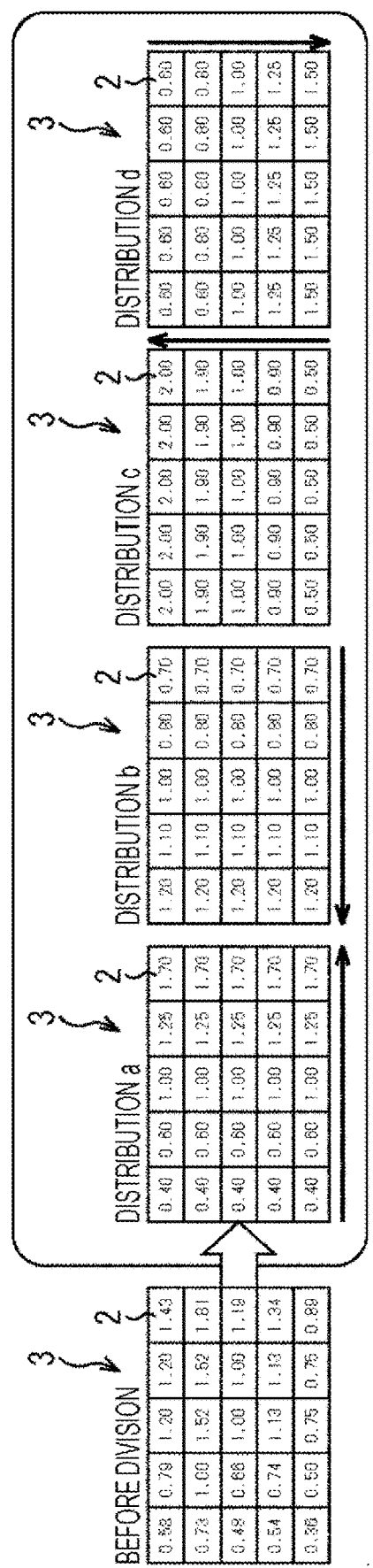
FIG. 4 is a diagram for explaining decomposition of distribution of Gr/Gb ratio.

When embodying the present technology, first, a complicated distribution of Gr/Gb balance is cut and divided into simple shapes. For example, as illustrated in FIG. 4, since the distribution of Gr/Gb ratios illustrated in FIG. 2 is a product of a plurality of distributions such as a distribution "a" where the value increases in the direction from the left to the right, a distribution "b" where the value increases in the direction from the right to the left, a distribution "c" where the value increases in the direction from the bottom to the top, and a distribution "d" where the value increases in the direction from the top to the bottom, the distribution of Gr/Gb ratios can be decomposed into these distributions.

Figure 5:
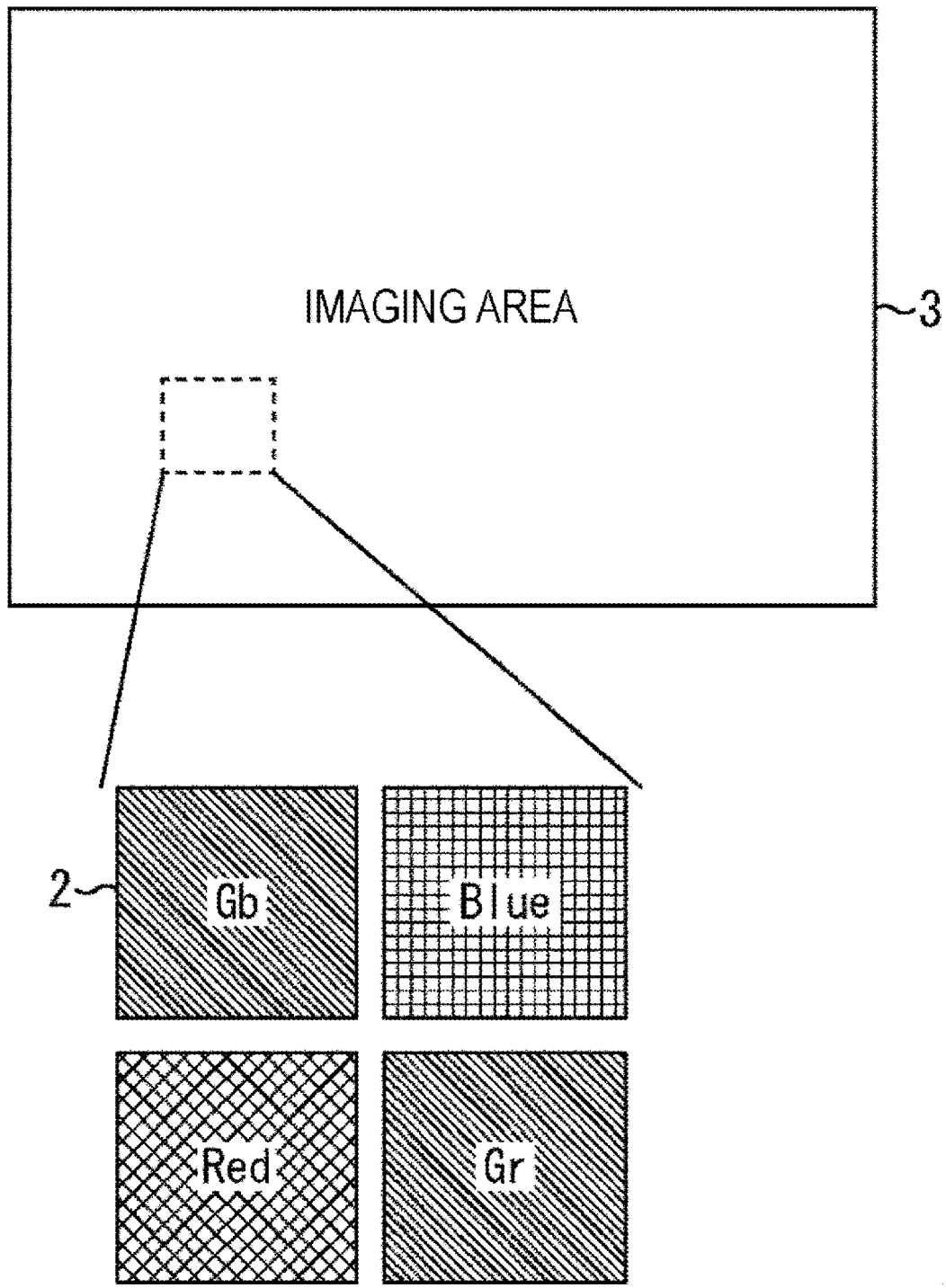
FIG. 5 is a diagram illustrating an example of a pixel array.
Figure 6:
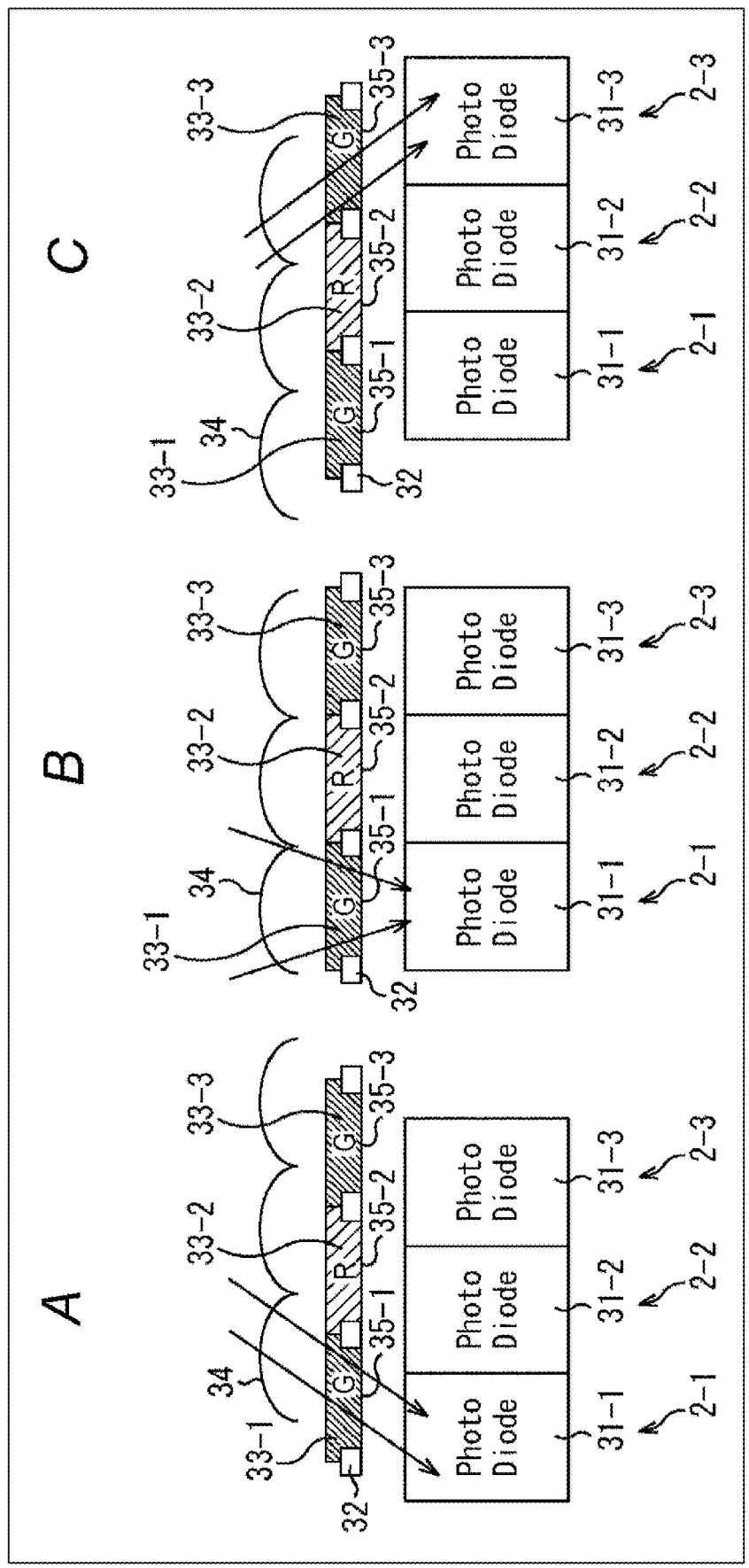
FIG. 6 is a cross-sectional diagram illustrating an example of a pixel structure.

The pixel 2 is a portion of the imaging area 3. The pixels are arrayed as illustrated in FIG. 5, and pixel structures are formed as illustrated in FIGS. 6A to 6C. In an example of FIG. 5, arrays of four pixels 2 are illustrated in the imaging area 3, and these four pixels 2 are disposed repeatedly. In the array, a blue pixel 2 is disposed to the right side of the Gb pixel 2, a red pixel 2 is disposed to the lower side of the Gb pixel 2, and a Gr pixel 2 is disposed to the right side of the red pixel 2.

<Example of Pixel Structure of the Present Technology>

FIG. 6A is a cross-sectional diagram illustrating a pixel structure in the left end of an image height, FIG. 6B is a cross-sectional diagram illustrating a pixel structure in an image height center, and FIG. 6C is a cross-sectional diagram illustrating a pixel structure in an image height right end. In the examples of FIGS. 6A to 6C, downward slanting arrows indicate optical paths, and cross sections of three pixels 2-1 to 2-3 are illustrated.

In each case of FIGS. 6A to 6C, a light-shielding film 32 having openings 35-1 to 35-3 formed to irradiate respective photodiodes 31-1 to 31-3 of the pixels 2-1 to 2-3 with light is formed over the photodiodes, and color filters 33-1 to 33-3 are formed on the light-shielding film. In addition, in the embodiment, the light-shielding film is assumed to include a completely light-shielding film, a substantially light-shielding film, and a light-reducing film. In addition, on-chip lenses 34 are disposed on the color filters 33-1 to 33-3. In addition, the on-chip lens 34 is formed for each of the pixels 2-1 to 2-3.

Figure 7:
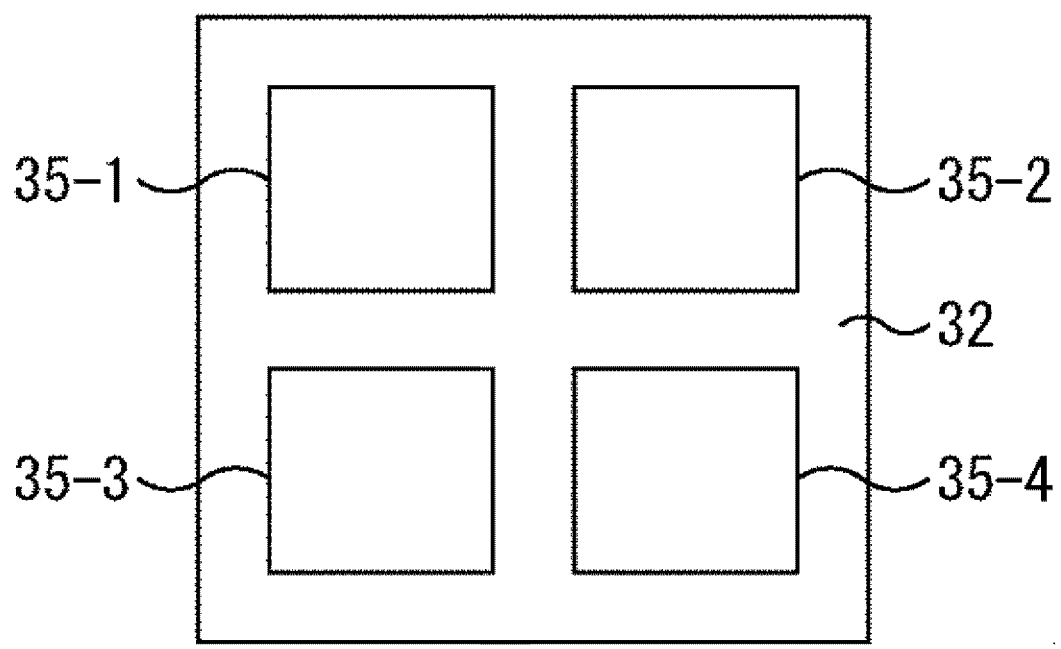
FIG. 7 is a diagram illustrating an example of layout of a light-shielding film for four pixels.

FIG. 7 is a diagram illustrating an example of layout of a light-shielding film for four pixels. As illustrated in FIG. 7, the light-shielding film 32 is configured so that four openings 35-1 to 35-4 for four pixels are laid out side by side. In the present technology, sides constituting the light-shielding film 32 are regarded as individual adjusting parameters.

Figure 8:
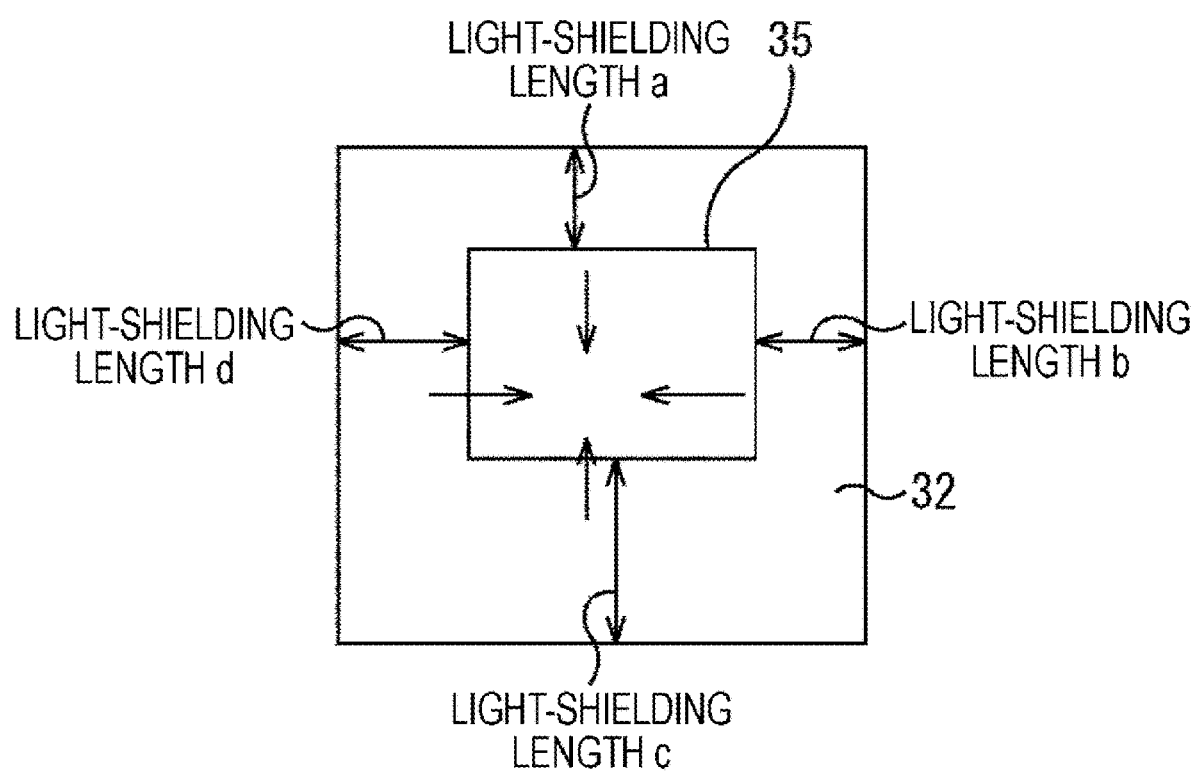
FIG. 8 is a diagram illustrating an example of layout of a light-shielding film for one pixel.

FIG. 8 is a diagram illustrating an example of layout of a light-shielding film for one pixel. For example, as illustrated in FIG. 8, a length from the upper side of the light-shielding film 32 to the upper side of the opening 35 is set as a light-shielding length "a"; and a length from the right side of the light-shielding film 32 to the right side of the opening 35 is set as a light-shielding length "b". A length from the lower side of the light-shielding film 32 to the lower side of the opening 35 is set as a light-shielding length "c", and a length from the left side of the light-shielding film 32 to the left side of the opening 35 is set as a light-shielding length "d". In a case where light is focused on the center of the opening 35, sensitivity can be decreased by extending any side of the light-shielding film 32 to the center. Namely, in the case of adjusting the sensitivity to be decreased, there is no need to simultaneously change all the sides, but the adjusting may be achieved by moving only a specific side. In this manner, since each side is regarded as individual adjusting parameter, the adjusting parameter can be adjusted for each pixel, and the opening can be expressed by ratios (and corresponding shapes) of lengths of the sides which are different according to the image height. Therefore, a complicated inside-angle-of-view distribution can be corrected.

In the present technology, the distribution "a" decomposed in FIG. 4 is corrected by using the light-shielding length "a" as a parameter, the distribution "b" is corrected by using the light-shielding length "b" as a parameter, the distribution "c" is corrected by using the light-shielding length "c" as a parameter, and the distribution "d" is corrected by using the light-shielding length "d" as a parameter. As a result, since the layout is formed in combination of the light-shielding lengths "a" to "d", layout design capable of correcting the complicated shape illustrated in FIG. 2 can be achieved.

The light-shielding lengths may be corrected, for example, by coordinates based on the following Mathematical Formulas (1) to (4). Herein, it is assumed that A to L are arbitrary integer numbers and x and y inside an angle of view denote respective horizontal and vertical coordinates.

Light-shielding length "$a$"=$Ay^2+By+C$ (1)

Light-shielding length "$b$"=$Dx^2+Ex+F$ (2)

Light-shielding length "$c$"=$Gy^2+Hy+I$ (3)

Light-shielding length "$d$"=$Jx^2+Kx+L$ (4)

In the case of the above-described Mathematical Formulas (1) to (4), the horizontal distribution is canceled by the light-shielding lengths "b" and "d", and the vertical distribution is canceled by the light-shielding lengths "a" and "c". However, these al-locations or mathematical formulas are arbitrary ones, which may not be the same as the above ones. For example, the mathematical formulas may be third order equations or fourth order equations or may simultaneously have x and y parameters in the same mathematical formula (for example, wiring length a=$Ax^2$+Bxy+$Cy^2$+D or the like). In addition, the shape may not be changed into a linear shape or may be changed into a non-linear shape.

In addition, in order to individually control these wiring lengths, an aperture ratio may be changed. However, the aperture ratio is not necessarily changed. For example, although the light-shielding length "a" is increased, if the light-shielding length "b" is decreased (namely, if the shape is changed), the aperture ratio is maintained. In addition, in a case where contribution rates of the light-shielding lengths "a" and "b" and the like to the sensitivity, the sensitivity can be changed without a change of the aperture ratio.

With the miniaturization, an aperture width has been closer to a wavelength size of light. If the aperture ratio is easily changed, a transmittable wavelength is limited, and thus, spectral characteristics are influenced. However, in the present technology, the sensitivity can be adjusted while the aperture ratio is maintained. In addition, the aperture ratio may be changed.

Modified Example (Shape)

Figure 9:
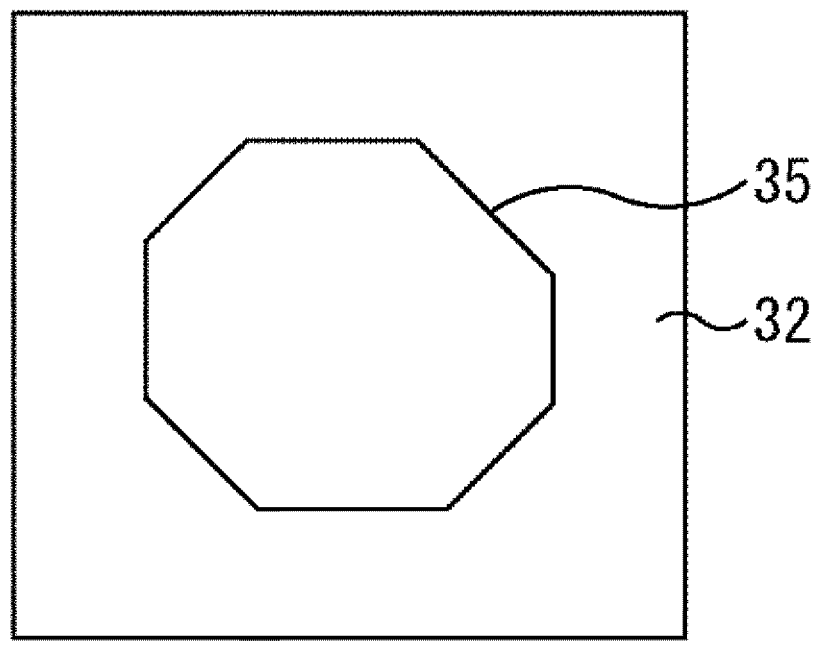
FIG. 9 is a diagram illustrating another example of layout of a light-shielding film for one pixel.
Figure 10:
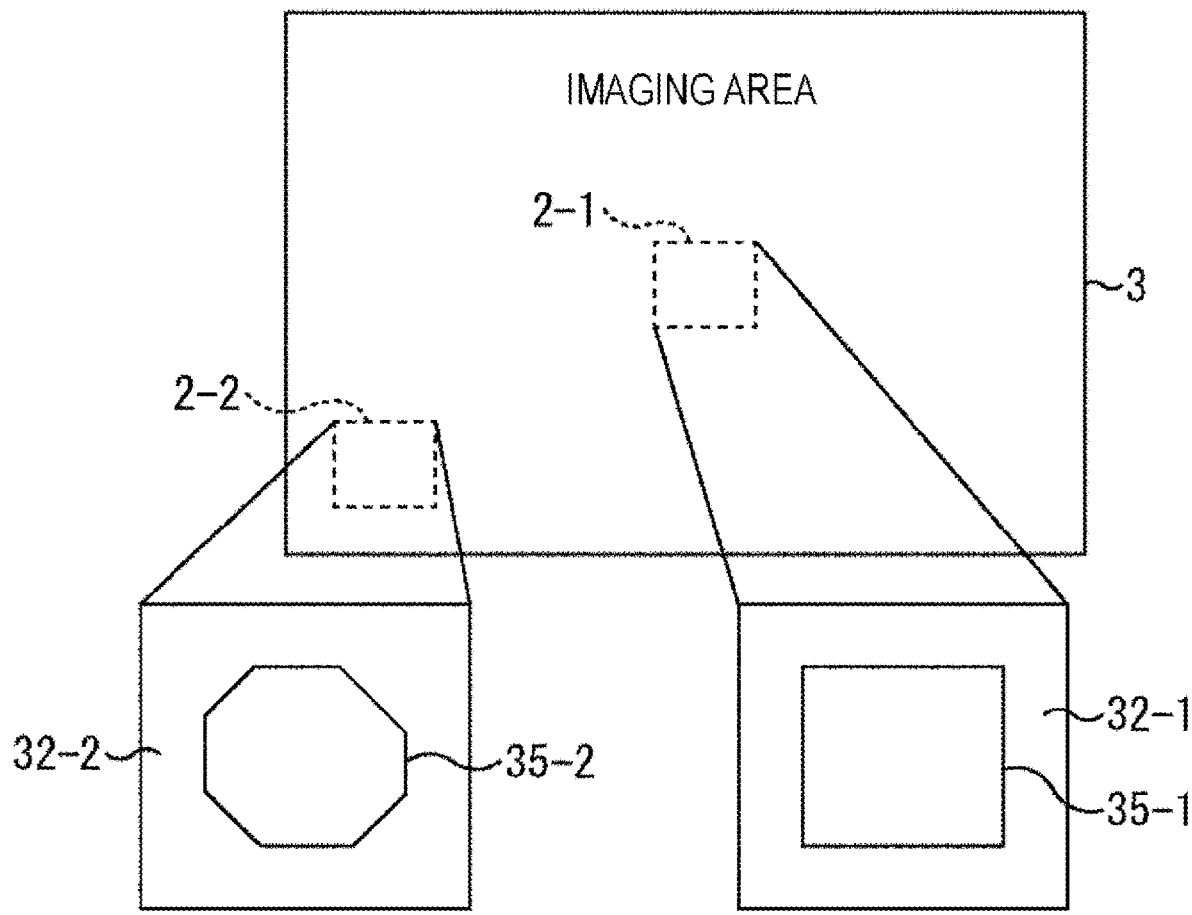
FIG. 10 is a diagram illustrating changed examples of layout of a light-shielding film for one pixel according to an image height.

In order to allow more complicated adjusting to be available, the number of "sides" described above with reference to FIG. 8 may be increased. For example, as illustrated in FIG. 9, the opening 35 of the light-shielding film 32 is laid out so as to be formed in an octagon. In addition, as illustrated in FIG. 10, in the light-shielding film 32-1 of the pixel 2-1 at the center of the image height, a quadrangular opening 35 is laid out. If the side is increased according to the image height, in the light-shielding film 32-2 of the pixel 2-2, a pentagonal or more (for example, octagonal) opening 35-2 may be laid out. In addition, the sides may be decreased according to the image height.

Figure 11:
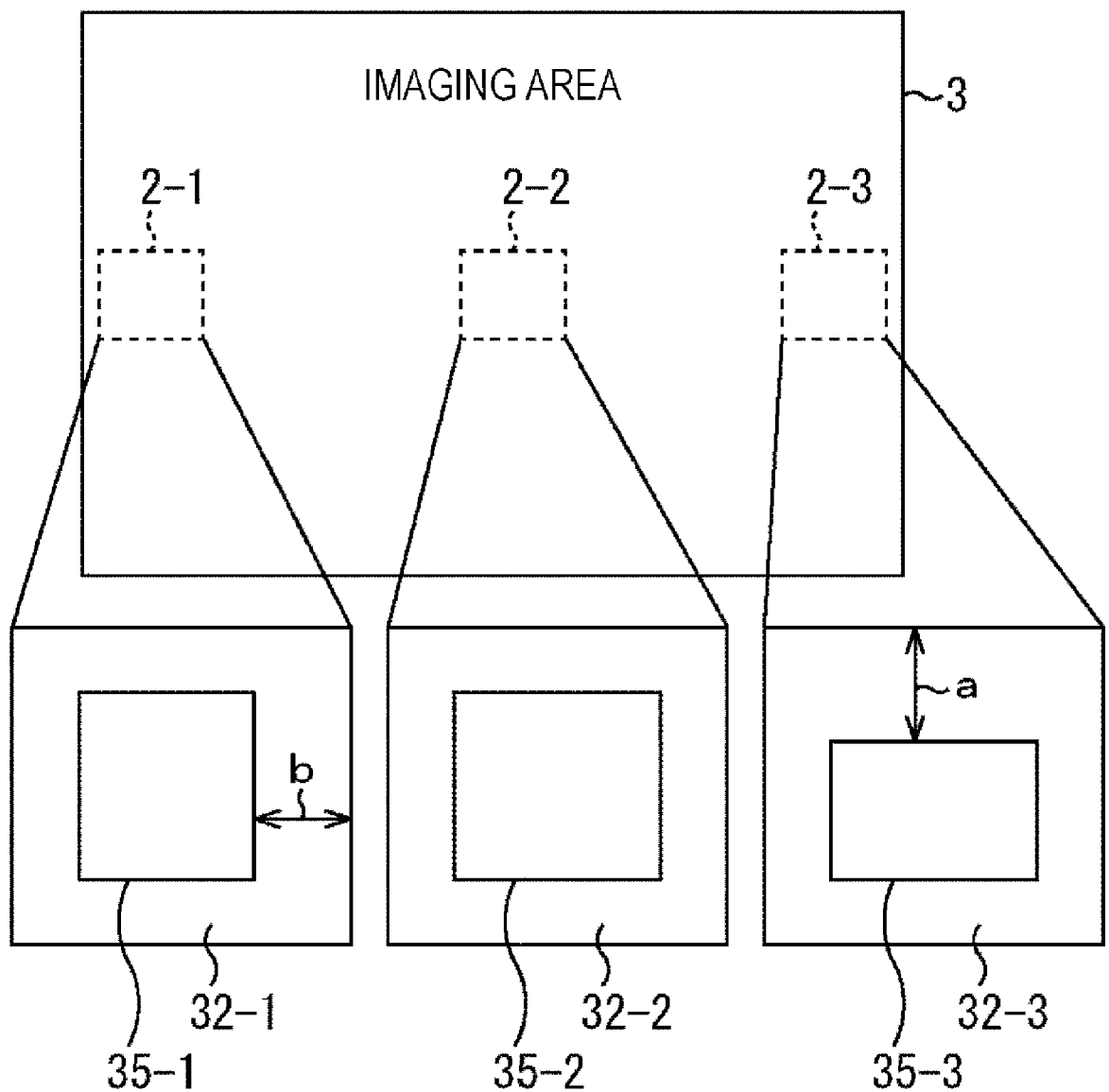
FIG. 11 is a diagram illustrating changed examples of layout of a light-shielding film for one pixel according to an image height.

In addition, as illustrated in FIG. 11, the sides may be limited so as to be changed by the image height or an image limit. For example, in the example of FIG. 11, in the pixel 2-2 at the center of the image height, an opening 35-2 with four sides having the same width is laid out. In contrast, in the pixel 2-1 at the left side of the image limit, only the light-shielding length "b" is changed, and in the pixel 2-2 at the right side of the image limit, only the light-shielding length "a" is changed.

Figure 12:
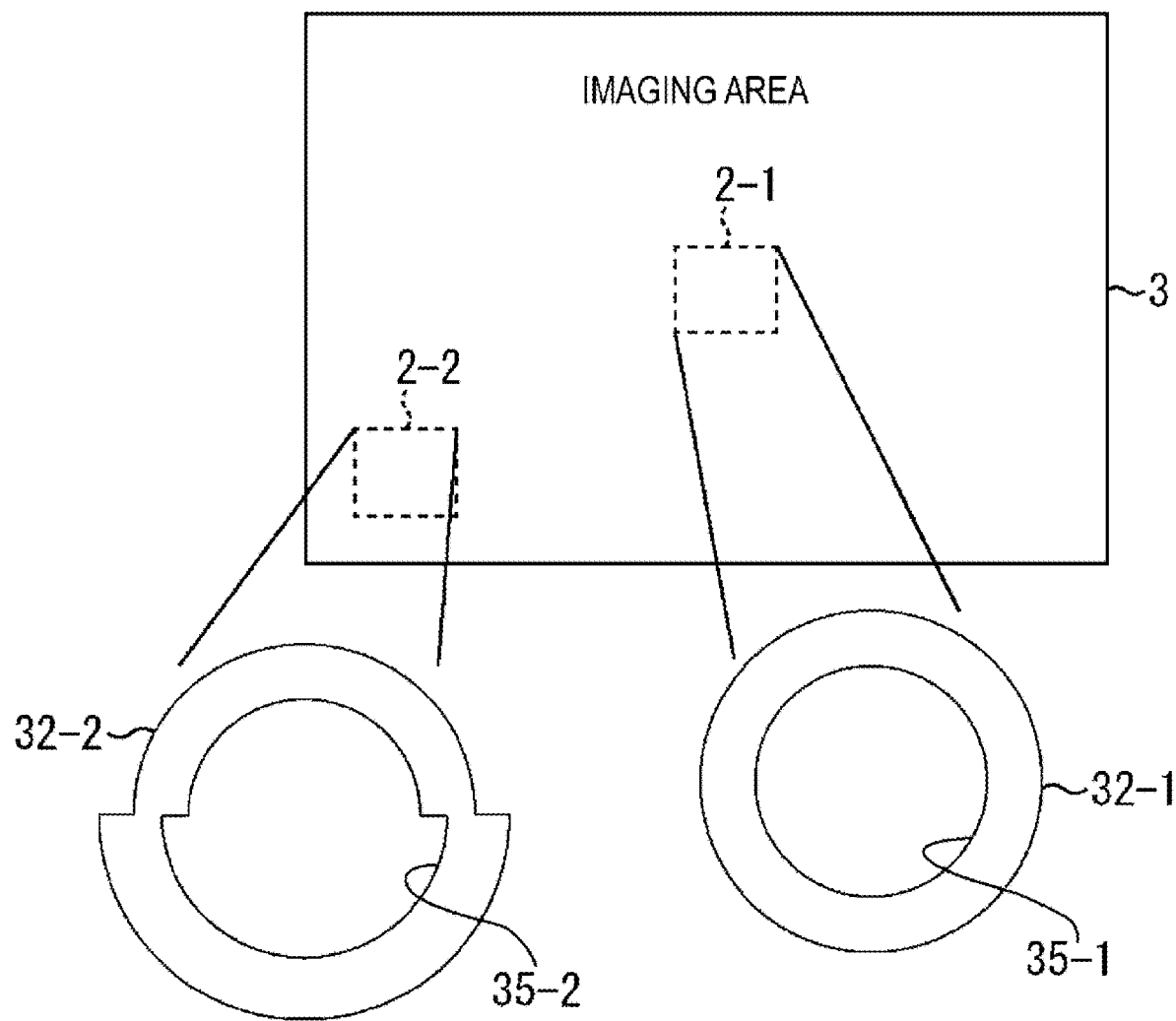
FIG. 12 is a diagram illustrating changed examples of layout of a light-shielding film for one pixel according to an image height.

In addition, as illustrated in FIG. 12, the opening 35 may be configured with two sides. In the example of FIG. 12, in the pixel 2-1 at the center of the image height, an opening 35-1 having a circle, that is, one side is laid out. In contrast, in the pixel 2-2 at the left side of the image limit, an opening 35-2 having two semi-circles, that is, two sides are laid out, using each semi-circle as one side.

Modified Example (Material)

In addition, in the above description, although the example where the light-shielding film 32 is made of a metal is described, the light-shielding method is not limited to a metal film, but for example, covering between color filters may also be used. If filters for a plurality of colors exist on the optical path, most colors are absorbed by the filter for the plurality of colors.

Figure 13:
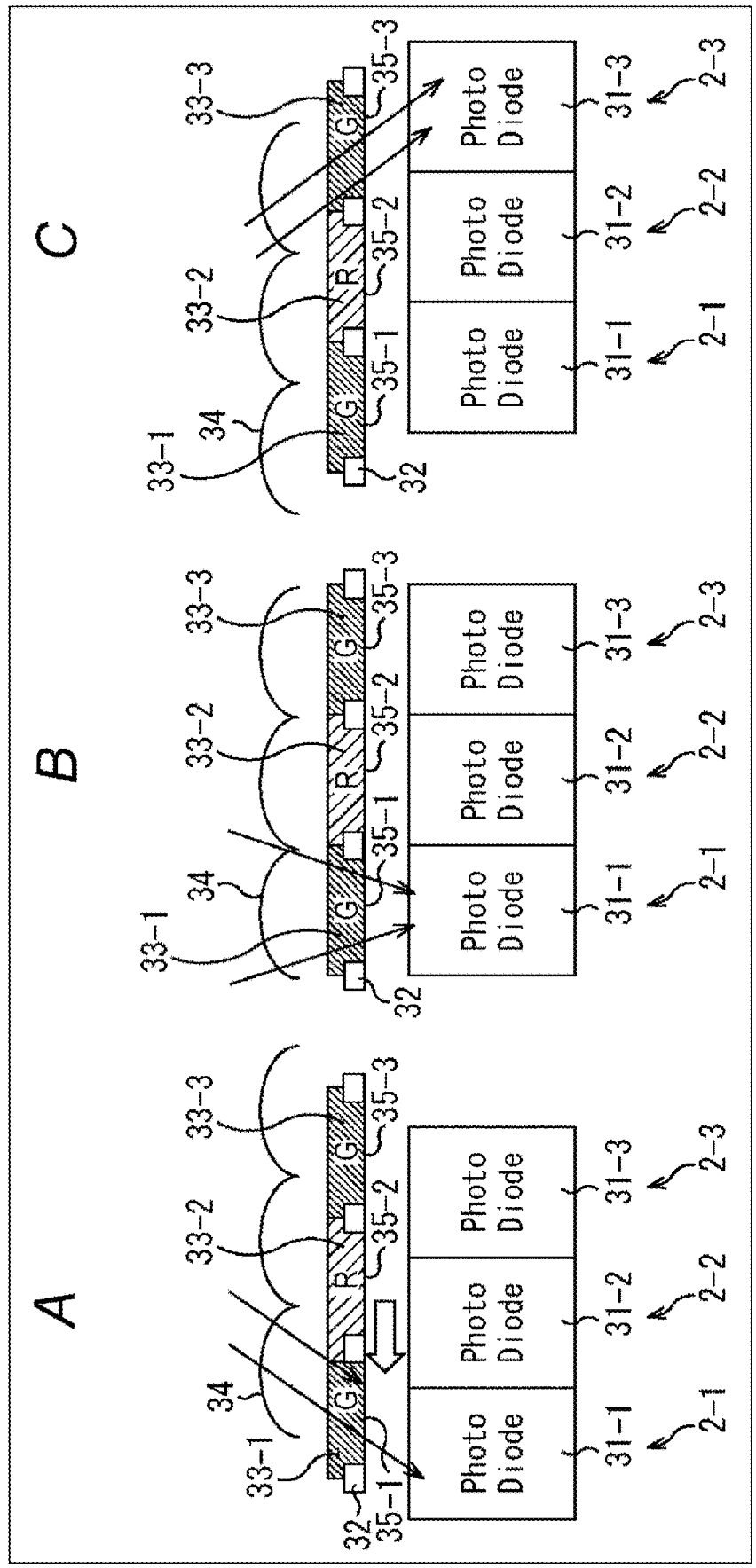
FIG. 13 is a cross-sectional diagram illustrating light shielding by covering with color filters.

FIG. 13A is a cross-sectional diagram illustrating a pixel structure in the left end of an image height, FIG. 13B is a cross-sectional diagram illustrating a pixel structure in the center of the image height, and FIG. 13C is a cross-sectional diagram illustrating a pixel structure in the right end of the image height. In the examples of FIGS. 13A to 13C, cross sections of three pixels 2-1 to 2-3 are illustrated. In addition, in FIGS. 13A to 13C, downward slanting arrows indicate optical paths.

In the example of FIG. 13B or 13C, light passing through a red color filter 33-2 has only red color component. However, in the example of FIG. 13A, a green color filter 33-1 also exists on the optical path passing through the red color filter 33-2. Since the green color filter 33-1 transmits only the green color component, most of the light of the optical path is shielded.

In addition, practically, with respect to wavelength dependency of the color filter on the transmitting component, there is slight covering, so that a portion of intermediate wavelength of R and G is transmitted. In addition, according to a thickness of the color filter, there is a component transmitting in each wavelength. However, since light-reducing can be achieved by using the covering with the color filter, sensitivity adjusting is available.

Figure 14:
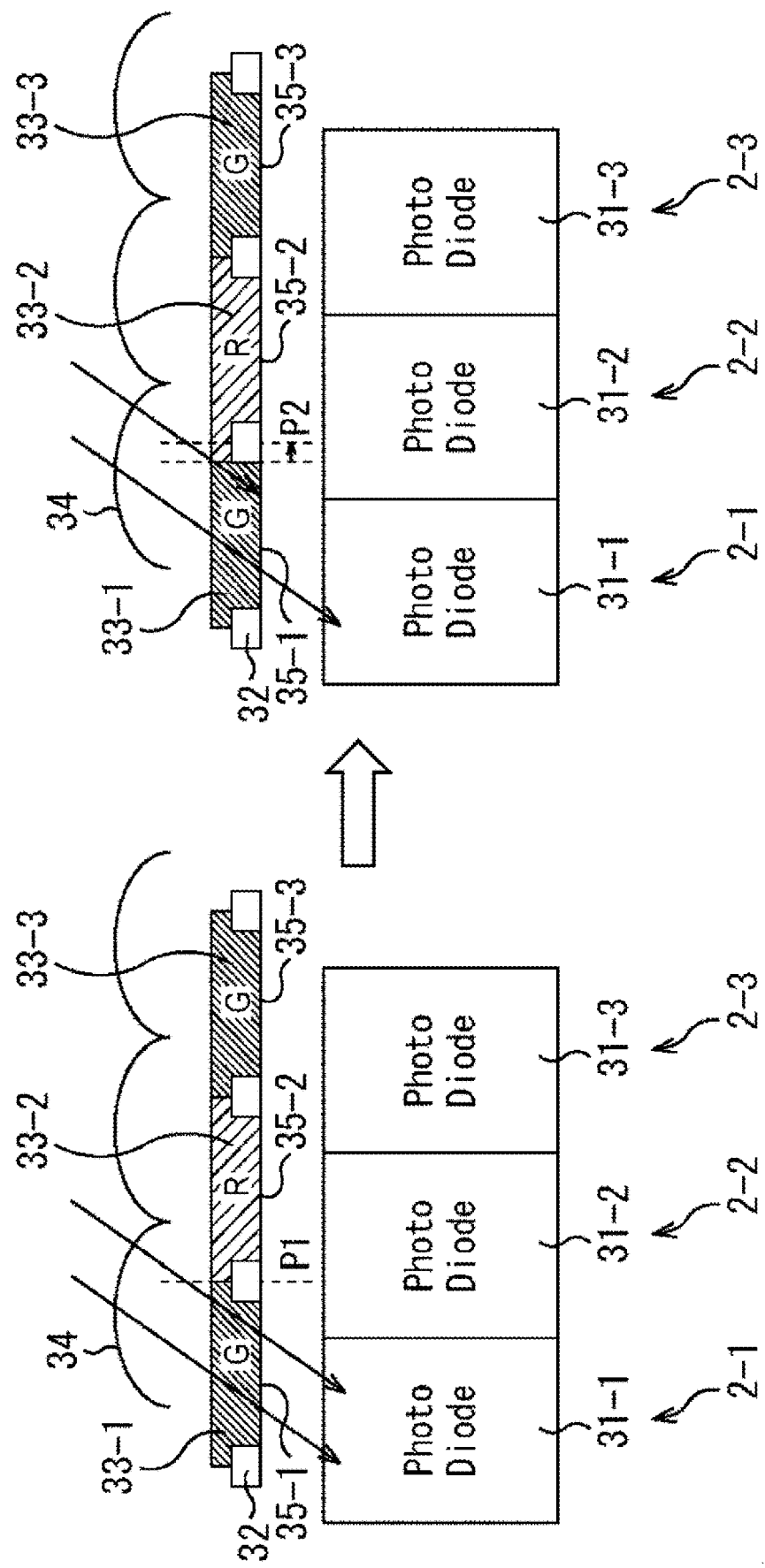
FIG. 14 is a cross-sectional diagram illustrating an example of covering with color filters.

An example where a plurality of color filters exists on the optical path will be described with reference to FIG. 14. In the example of FIG. 14, at a position P1 of the light-shielding film 32 between the pixel 2-1 and the pixel 2-2, only the green color filter 33-1 exists on the optical path indicated by arrows.

On the other hand, if the position P1 of the light-shielding film 32 between the pixel 2-1 and the pixel 2-2 is shifted to a position P2 at the slightly right side thereof, the red color filter 33-2 and the green color filter 33-1 exist on the optical path indicated by arrows, so that the light of the optical path can be reduced.

Figure 15:
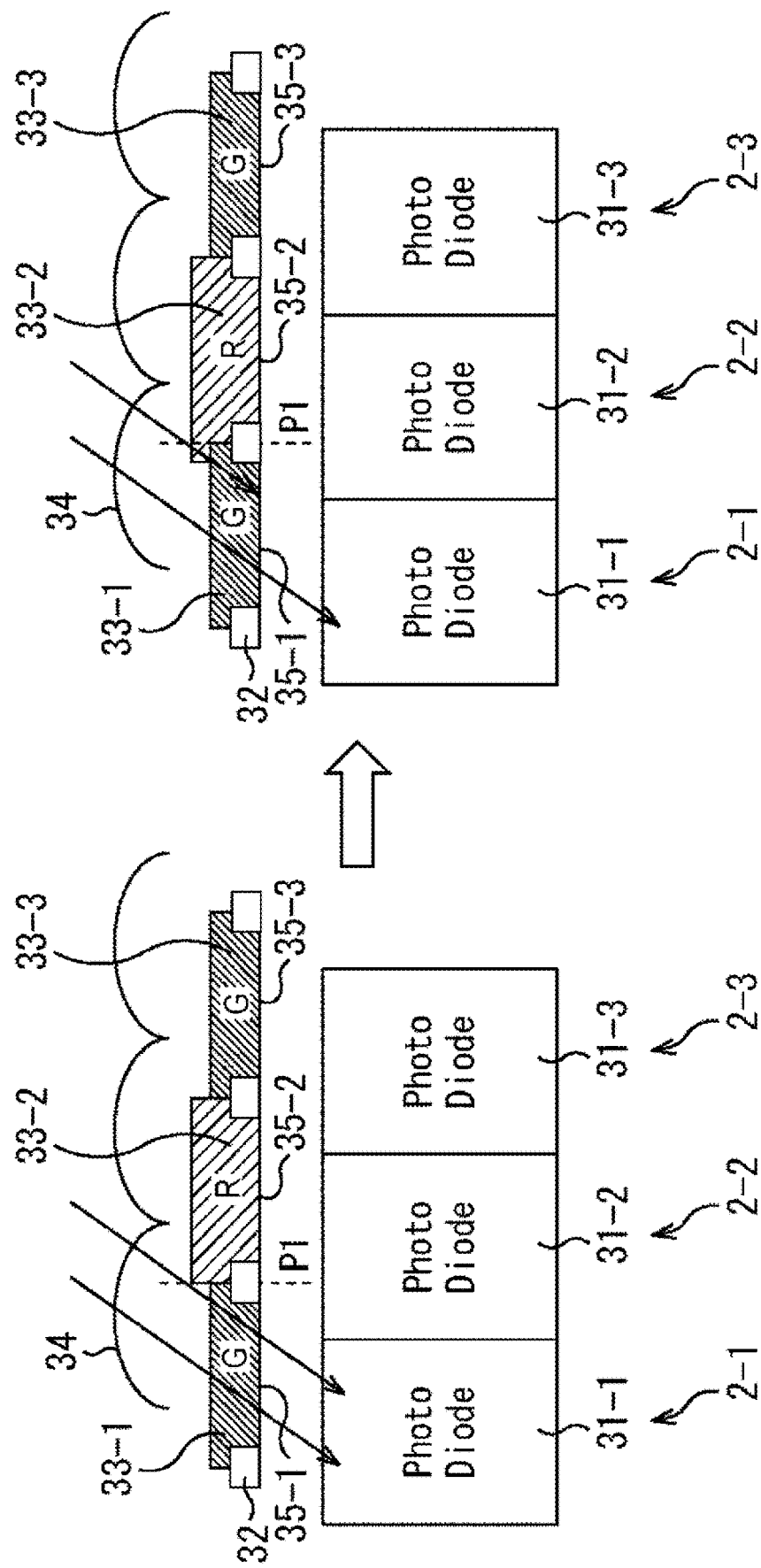
FIG. 15 is a cross-sectional diagram illustrating another example of covering with color filters.

An example where a plurality of color filters physically overlaps each other will be described with reference to FIG. 15. In the example of FIG. 15, at the position P1 of the light-shielding film 32 between the pixel 2-1 and the pixel 2-2, the green color filter 33-1 and the red color filter 33-2 do not physically overlap each other.

On the other hand, at the position P1 of the light-shielding film 32 between the pixel 2-1 and the pixel 2-2, the green color filter 33-1 and the red color filter 33-2 physically overlap each other. Therefore, the red color filter 33-2 and the green color filter 33-1 exist on the optical path indicated by arrows, so that the light of the optical path can be reduced.

Heretofore, the width of the covering with the color filter is regarded as the light-shielding length, and thus, the sensitivity may be adjusted by using the above-described method instead of a metal film, or the above-described light-shielding film may be combined.

In addition, in the case of using the covering with the color filter, the wavelength dependency occurs as described above. However, in a case where the Gr/Gb color ratio or the color shading itself has wavelength dependency, it may be preferable to treat with a method having wavelength dependency, a shape distribution having wavelength dependency may be corrected by using the color filters, an inside distribution of dependency may be corrected by using the light-shielding film, or correction may be performed by using a combination thereof.

As described heretofore, in the present technology, since the lengths of the sides of the openings formed in the light-reducing member which is formed on upper layers (lens side) of the photoelectric conversion members performing photoelectric conversion in the pixels of the imaging area having the pixel array to perform light-reducing or light-shielding can be individually adjusted, the opening is configured so that the ratio of lengths of sides and the shape of the opening are different according to the image height.

Therefore, adjusting can be performed for every pixel, and in other words, adjusting can be performed for every color (Gr/Gb, namely, colors of color filers of adjacent pixels adjacent to the pixel) or for every specific pixel such as a phase difference detection pixel described in the second embodiment.

Therefore, according to an embodiment of the present technology, it is possible to correct even an in-screen distribution of which the correction of the Gr/Gb step difference, the color shading, or the like is complicated.

2. Second Embodiment (Example of Application of the Present Technology)

Figure 16:
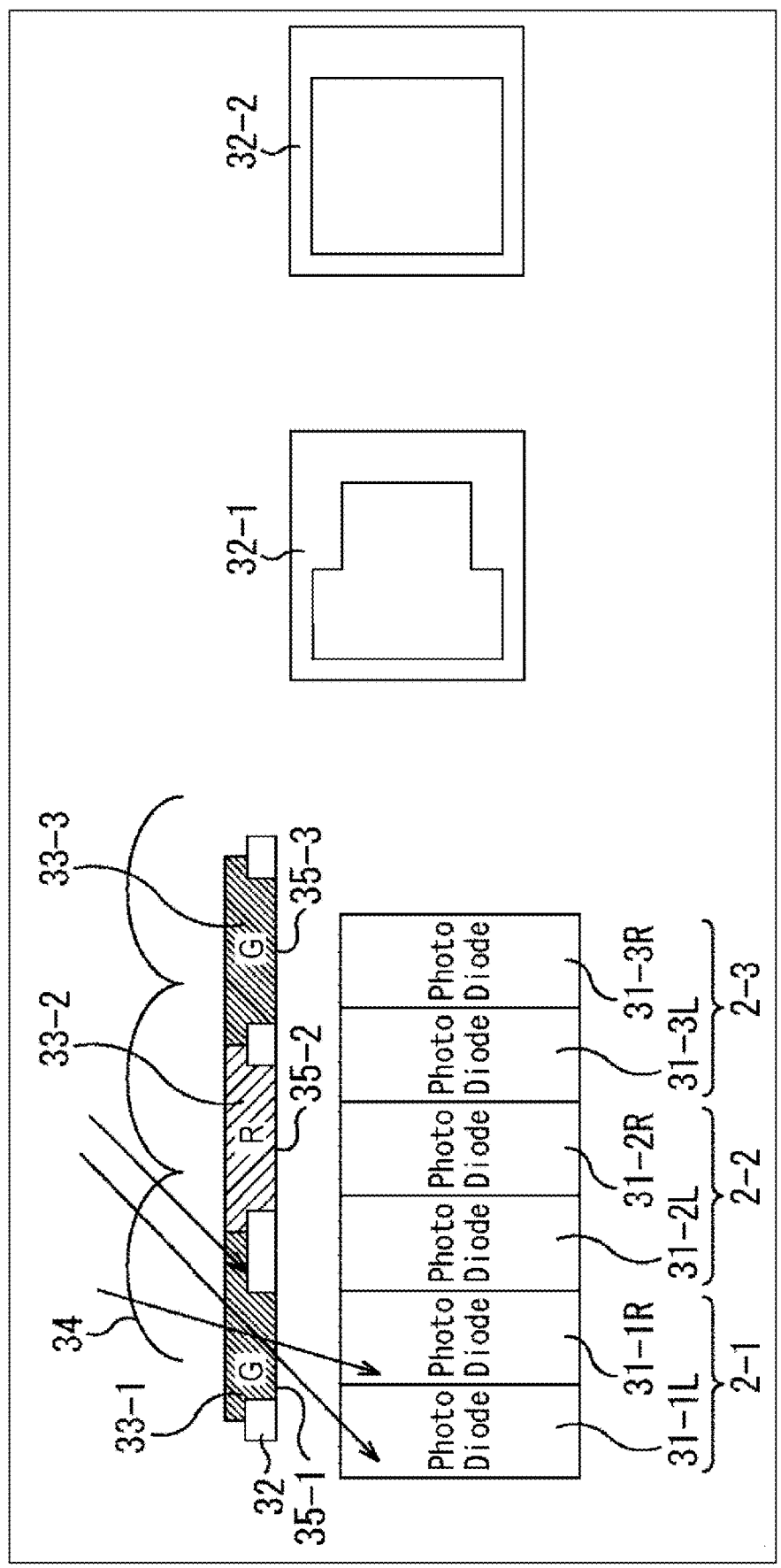
FIG. 16 is a cross-sectional diagram illustrating a pixel structure having a plurality of photodiodes for one on-chip lens.

FIG. 16 is a cross-sectional diagram illustrating a pixel structure having a plurality of photodiodes for one on-chip lens.

In the example of FIG. 16, a pixel 2-1 has left and right photodiodes 31-1L and 31-1R, and a light-shielding film 32 having an opening 35-1 for irradiating the photodiodes 31-1L and 31-1R with light is formed over the photodiodes. A pixel 2-2 has left and right photodiodes 31-2L and 31-2R, and a light-shielding film 32 having an opening 35-2 for irradiating the photodiodes 31-2L and 31-2R with light is formed over the photodiodes. A pixel 2-3 has left and right photodiodes 31-3L and 31-3R, and a light-shielding film 32 having an opening 35-3 for irradiating the photodiodes 31-3L and 31-3R with light is formed over the photodiodes. Color filters 33-1 to 33-3 are formed on the light-shielding film 32. In addition, on-chip lenses 34 are disposed on the color filters 33-1 to 33-3. In addition, the on-chip lens 34 is formed for each of the pixels 2-1 to 2-3.

In the case of this structure, if the pixel 2-1 is described, there is a need to adjust a difference in sensitivity between the left photodiode 31-1L and the right photodiode 31-1R as well as the Gr/Gb ratio. With respect to the difference in sensitivity, since the left photodiode 31-1L and the right photodiode 31-1R are regarded as individual pixels, the light-shielding film 32 is formed like the light-shielding film 32-1 or 32-2 illustrated in the right side of the figure. Therefore, the left photodiode 31-1L and the right photodiode 31-1R can be individually adjusted in the left and right.

Figure 17:
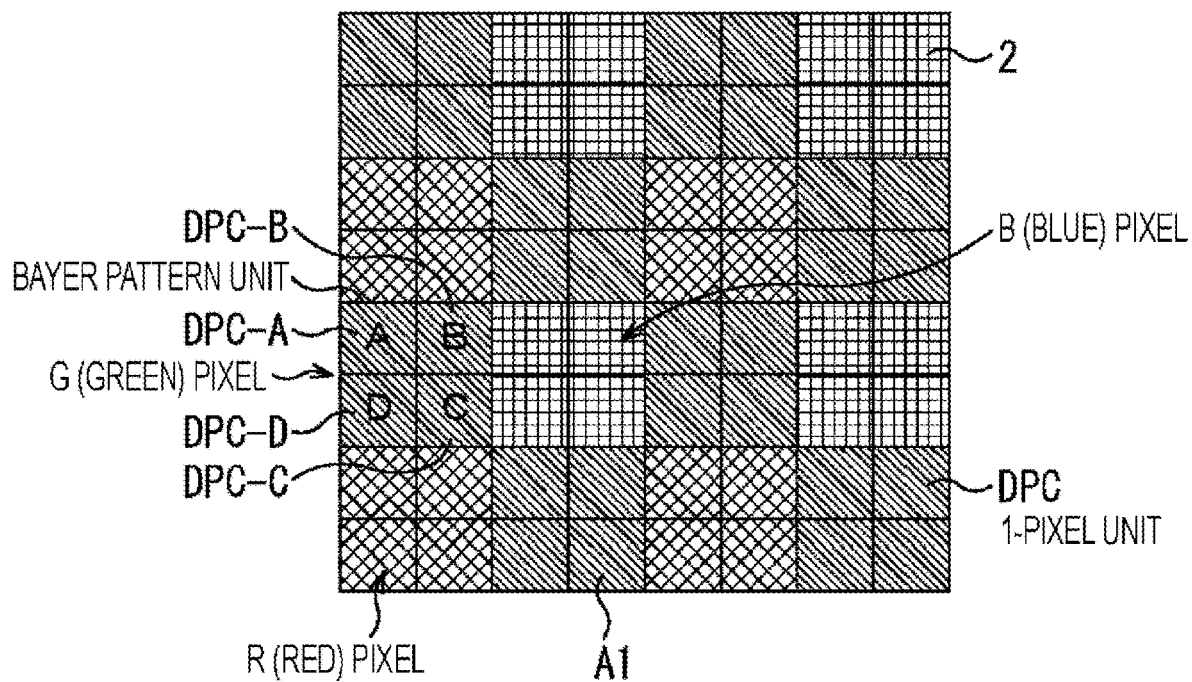
FIG. 17 is a diagram illustrating an example of a pixel divided array.

FIG. 17 illustrates a pixel divided array. The pixel divided array illustrated in FIG. 17 has features in that two or more of the same color pixels are continuously disposed, and on-chip lenses (not illustrated) are installed for individual pixels. In this array, since there are four of the same color pixels, if characteristics of the individual pixels are different, a difference in sensitivity occurs due to various factors such as a difference in design of adjacent pixels or photoelectric conversion members such as photodiodes. As disclosed in Japanese Patent No. 5664141, there is an application of this array where long exposure storage pixels and short exposure storage pixels are mixed. However, in the case of using in this application, if long storage pixel/short storage pixel is not a correct ratio, image quality is deteriorated. Therefore, similarly, application of the present technology to the pixel divided array of FIG. 17 is effective.

Figure 18:
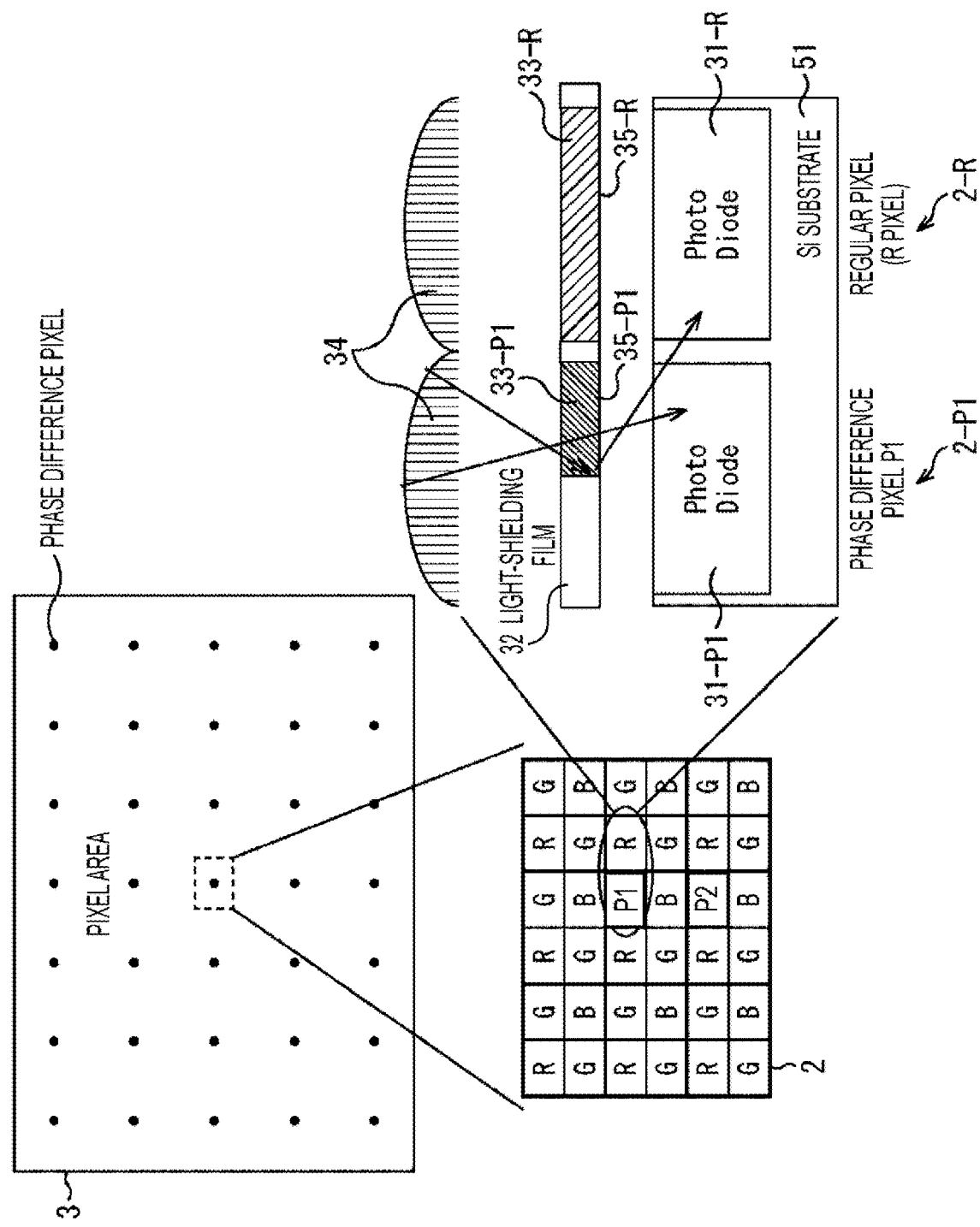
FIG. 18 is a cross-sectional diagram illustrating an example of a pixel structure for image-plane phase difference detection.

FIG. 18 is a diagram illustrating an example of a pixel structure for image-plane phase difference detection. In the example of FIG. 18, phase difference pixels P1, P2, . . . , Pn are illustrated to be installed at a certain interval in the pixel area 3. In addition, a regular pixel denotes a pixel which is normally used for imaging. In addition, in the enlarged diagram, the left pixel is the phase difference pixel 2-P1, and the right pixel is the regular pixel 2-R. Photodiodes 31-P1 and 31-R are formed on an Si substrate 51, and a light-shielding film 32 having openings 35-P1 and 35-R is installed on the photodiodes. Color filters 33-P1 and 33-R are formed on the light-shielding film 32, and on-chip lenses 34-P1 and 34-R are disposed on the color filters.

Figure 19:
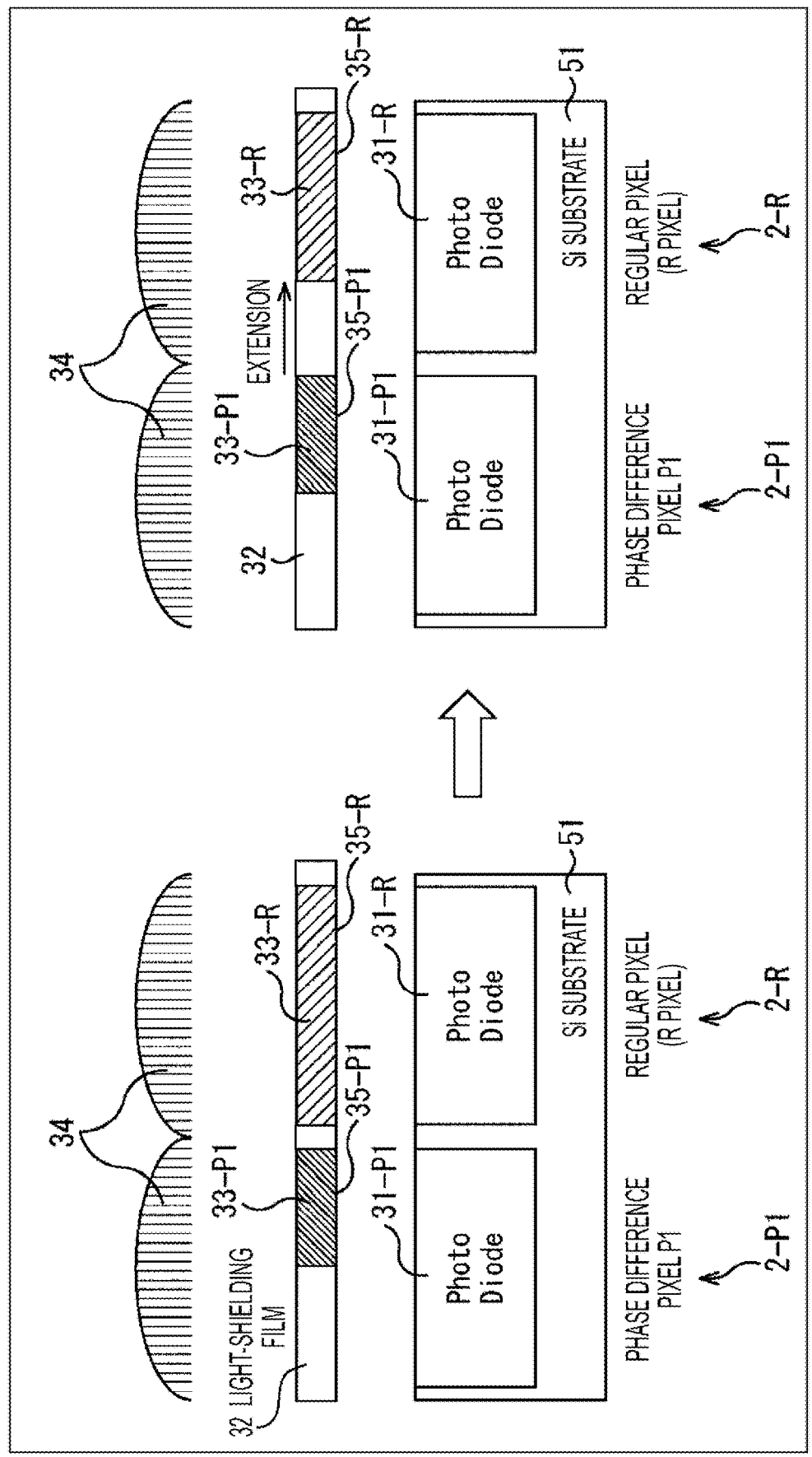
FIG. 19 is an expansion diagram of an array of shared pixels of FIG. 18.

In many cases, since the light-shielding film 32 is made of a metal, as indicated by arrows of FIG. 18, the phase difference pixel 2-P1 mixes colors due to reflection/irregular reflection from the metal light-shielding film 32, so that the sensitivity of surrounding pixels may be changed. As indicated by an arrow of FIG. 19, the present technology, that is, extension of the light-shielding length of any of the regular pixels of the light-shielding film 32 can be applied in order to adjust the sensitivity of other regular pixels disposed surrounding the regular pixel.

In addition, herein, "mixing colors" is assumed to include a minus side case where the sensitivity is decreased as well as a plus side case where the sensitivity is increased. This is because, in the adjacent pixel at the light shielding side of the phase difference detection pixel, the mixing colors is decreased in comparison with the normal case, and thus, there is a case where the output becomes minus.

As described heretofore, according to an embodiment of the present technology, it is possible to correct even a screen distribution of which the correction of the Gr/Gb step difference, the color shading, or the like is complicated.

In addition, by a correcting method including an amount of covering with the color filter, it is also possible to correct inside-screen distribution having wavelength dependency.

In a structure where a plurality of photoelectric conversion members is disposed for one on-chip lens, a difference in sensitivity between the pixels of the left and right sides can be also corrected.

In the pixel divided structure where a plurality of the same color pixels is arranged, a difference in sensitivity between the long-term and short-term storage pixels occurring at the time of generating an image having a high dynamic range can be prevented.

In an array including image-plane phase difference detection pixels, influence of a change in sensitivity on the surrounding pixels can be reduced.

According to the above-described technology, it is possible to implement an imaging apparatus having a higher image quality (low noise/low coloring).

In addition, since layout design can also be easily performed, it is possible to reduce design cost.

In addition, in the above description, although photodiodes are used as the photoelectric conversion members, devices other than the photodiodes may be used, and organic photoelectric conversion film or other photoelectric conversion members may be used. In addition, other structure using complementary color (cyan, magenta, or the like)-based color filters as well as primary color-based color filters may be used. With respect to the array, a clear pit array as well as a Bayer array may be used.

In addition, in this embodiment, a combination of the above-described embodiments may be available.

In addition, in the above description, although the example of a back surface irradiating solid-state imaging device is described, the present technology may also be applied to a front surface irradiating solid-state imaging device.

In addition, heretofore, although the configuration where the present technology is applied to a CMOS solid-state imaging device is described, the present technology may be applied to a solid-state imaging device such as a Charge Coupled Device (CCD) solid-state imaging device.

3. Third Embodiment (Example of Use of Image Sensor)

Figure 20:
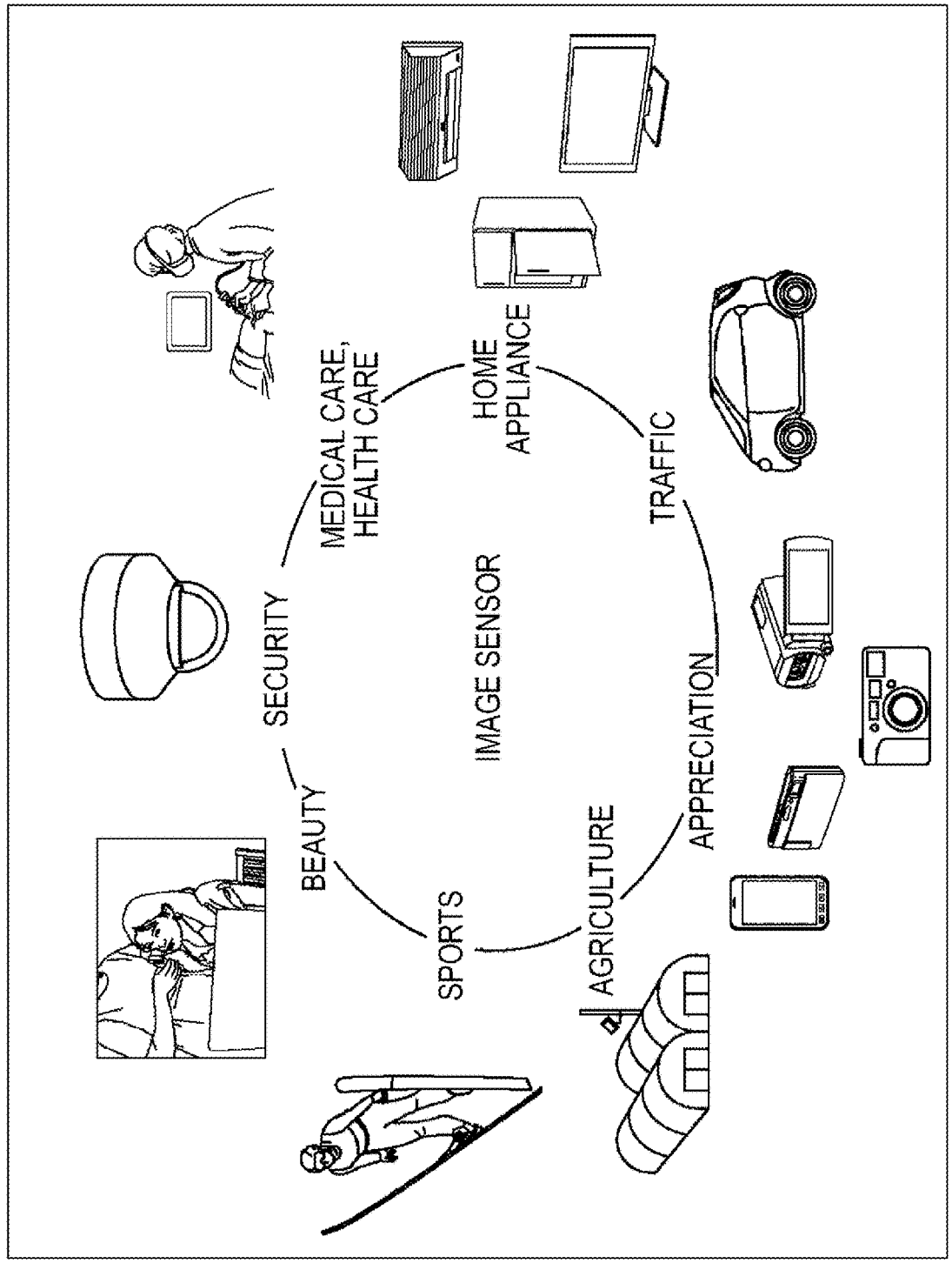
FIG. 20 is a diagram illustrating an example of use of an image sensor according to an embodiment of the present technology.

FIG. 20 is a diagram illustrating examples of use using the above-described solid-state imaging device.

The above-described solid-state imaging device (image sensor) can be used in various cases of sensing light such as visible light, infrared light, ultraviolet light, or X-rays, for example, as follows.

- Apparatuses capturing images provided for the use in appreciation such as a digital camera or a mobile apparatus with a camera function
- Apparatuses provided for the use in traffic such as an on-vehicle sensor imaging front and rear sides, surroundings, inside of a vehicle, a surveillance camera monitoring running vehicles and roads, or a distance measuring sensor measuring distances between vehicles for the purpose of safe driving such as automatic stop or recognition of driver's state or the like
- Apparatuses provided to home appliance such as a TV set, a refrigerator, or an airconditioner to image user's gesture and manipulate the home appliance according to the gesture
- Apparatuses provided for the use in medical care or health care such as an endoscope or an apparatus performing angiography by receiving infrared light
- Apparatuses provided for the use in security such as a surveillance camera for crime prevention or a camera for person authentication
- Apparatuses provided for the use in beauty such as a skin measurement instrument imaging skin or a microscope imaging scalp
- Apparatuses provided for the use in sports such as an action camera dedicated to sports applications or a wearable camera
- Apparatuses provided for the use in agriculture such as a camera for monitoring states of fields or crops

4. Fourth Embodiment (Example of Electronic Apparatus)

<Example of Configuration of Electronic Apparatus>

In addition, the present technology is not limited to the application to the solid-state imaging device, but it may also be applied to an imaging apparatus. Herein, the imaging apparatus denotes a camera system such as a digital still camera or a digital video camera, or an electronic apparatus such as a mobile phone having an imaging function. In addition, in some cases, a module form, that is, a camera module equipped in an electronic apparatus may be configured with an imaging apparatus.

Herein, a configuration example of an imaging apparatus which is one of electronic apparatuses according to an embodiment of the present technology will be described with reference to FIG. 21.

Figure 21:
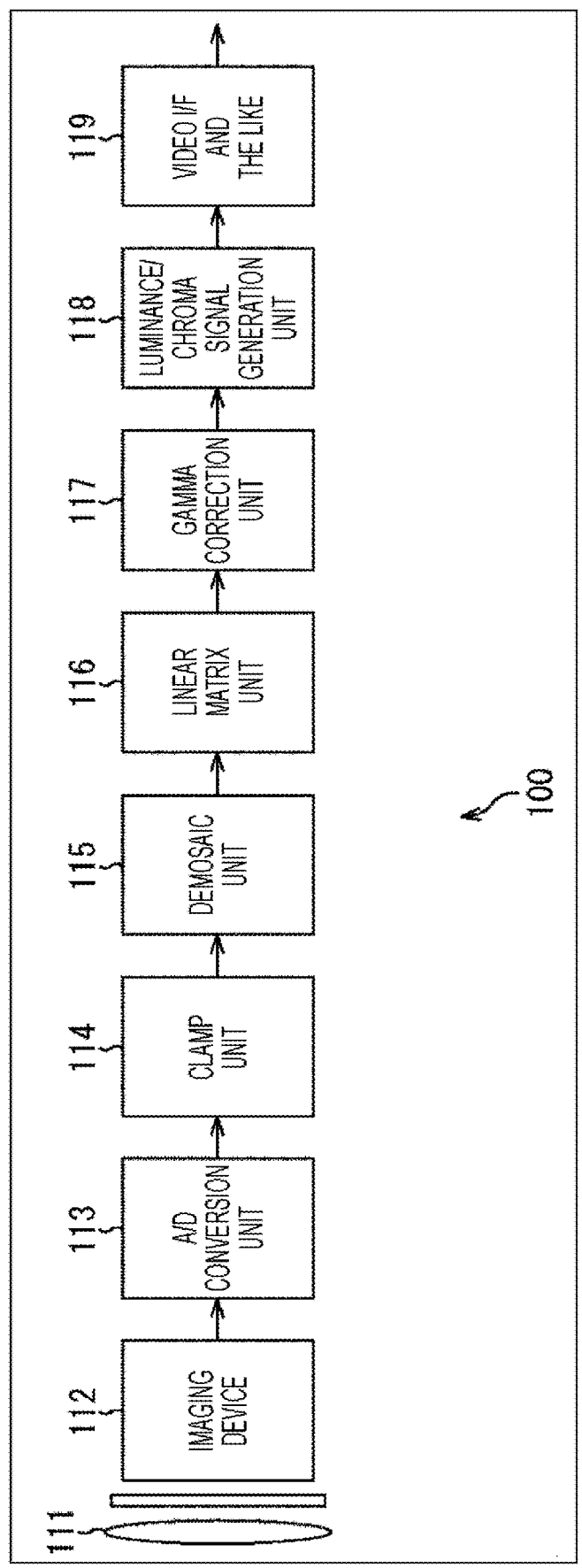
FIG. 21 is a block diagram illustrating a configuration example of an imaging apparatus according to an embodiment of the present technology.

An imaging apparatus 100 illustrated in FIG. 21 images a subject and outputs an image of the subject as electric signals (image data). As illustrated in FIG. 27, the imaging apparatus 100 is configured to include a lens system 101, an imaging device 102, an A/D conversion unit 103, a clamp unit 104, a demosaic unit 105, a linear matrix unit 106, a gamma correction unit 107, an luminance/chroma signal generation unit 108, and a video interface (IF) 109.

As the imaging device 102, the solid-state imaging device 1 according to the first embodiment of the present technology is installed. Therefore, it is possible to improve image quality of the imaging apparatus 100.

The A/D conversion unit 103 converts an analog signal of a subject image which is photoelectrically converted by the imaging device 102 to a digital value. The clamp unit 104 subtracts a black level of digital data (image data) of the subject image supplied from the A/D conversion unit 103. The demosaic unit 105 compensates the image data supplied from the clamp unit 104 for a color signal if necessary. The linear matrix unit 106 applies a leaner matrix to the image data supplied from the demosaic unit 105 to improve color reproduction or the like if necessary. The gamma correction unit 107 performs a gamma correction process on the image data supplied from the linear matrix unit 106 to smoothen luminance representation. The luminance/chroma signal generation unit 108 generates a luminance signal and a chroma signal from the image data supplied from the gamma correction unit 107. The video interface 109 outputs the luminance signal and the chroma signal supplied from the luminance/chroma signal generation unit 108.

Figure 22:
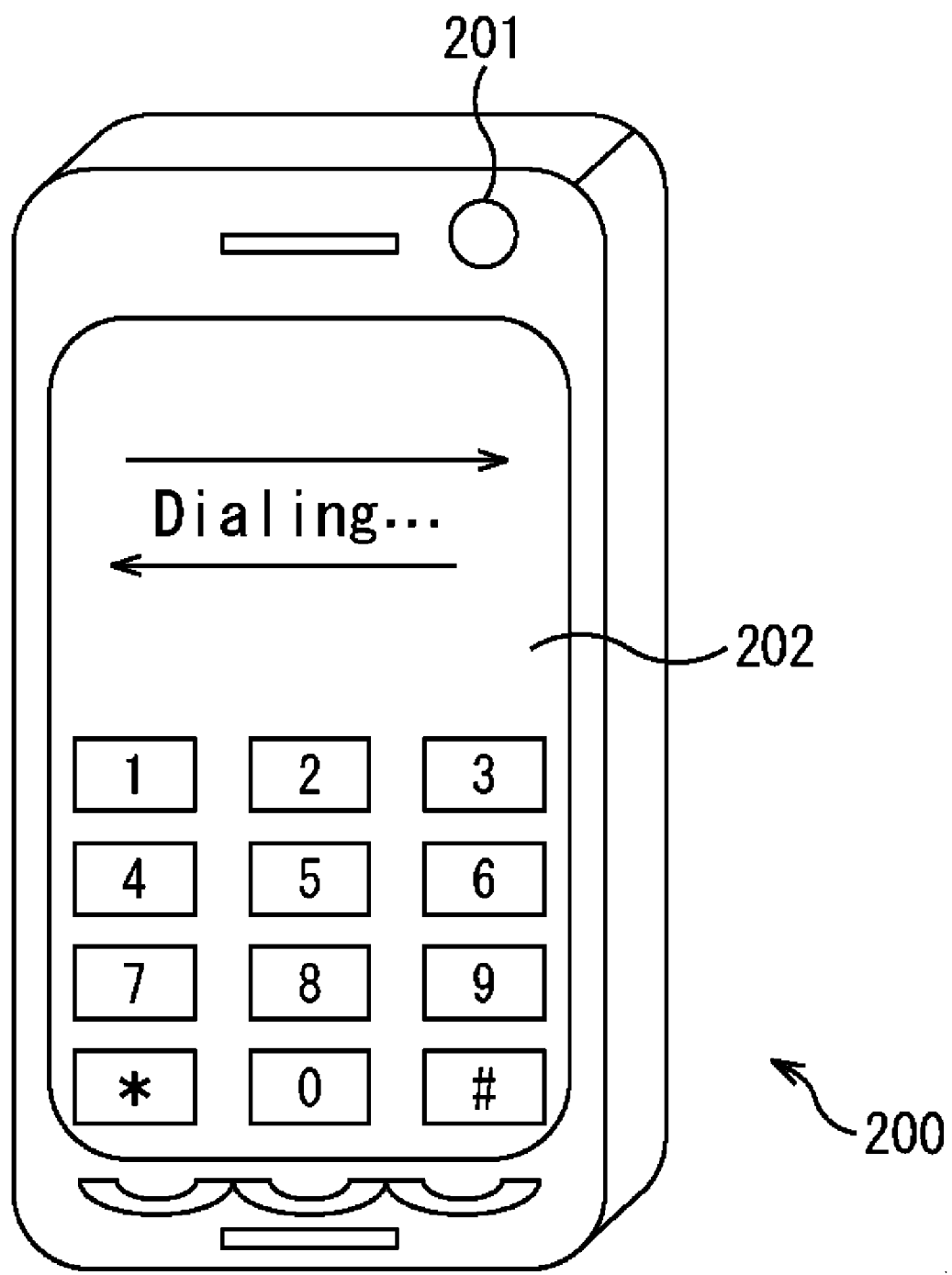
FIG. 22 is a diagram illustrating an example of outer appearance of a mobile communication terminal according to an embodiment of the present technology.

In addition, the solid-state imaging device according to an embodiment of the present technology can be incorporated into a mobile communication terminal 200 having an imaging device 201 and a display unit 202 where a touch panel is stacked, as illustrated in FIG. 22.

Figure 23:
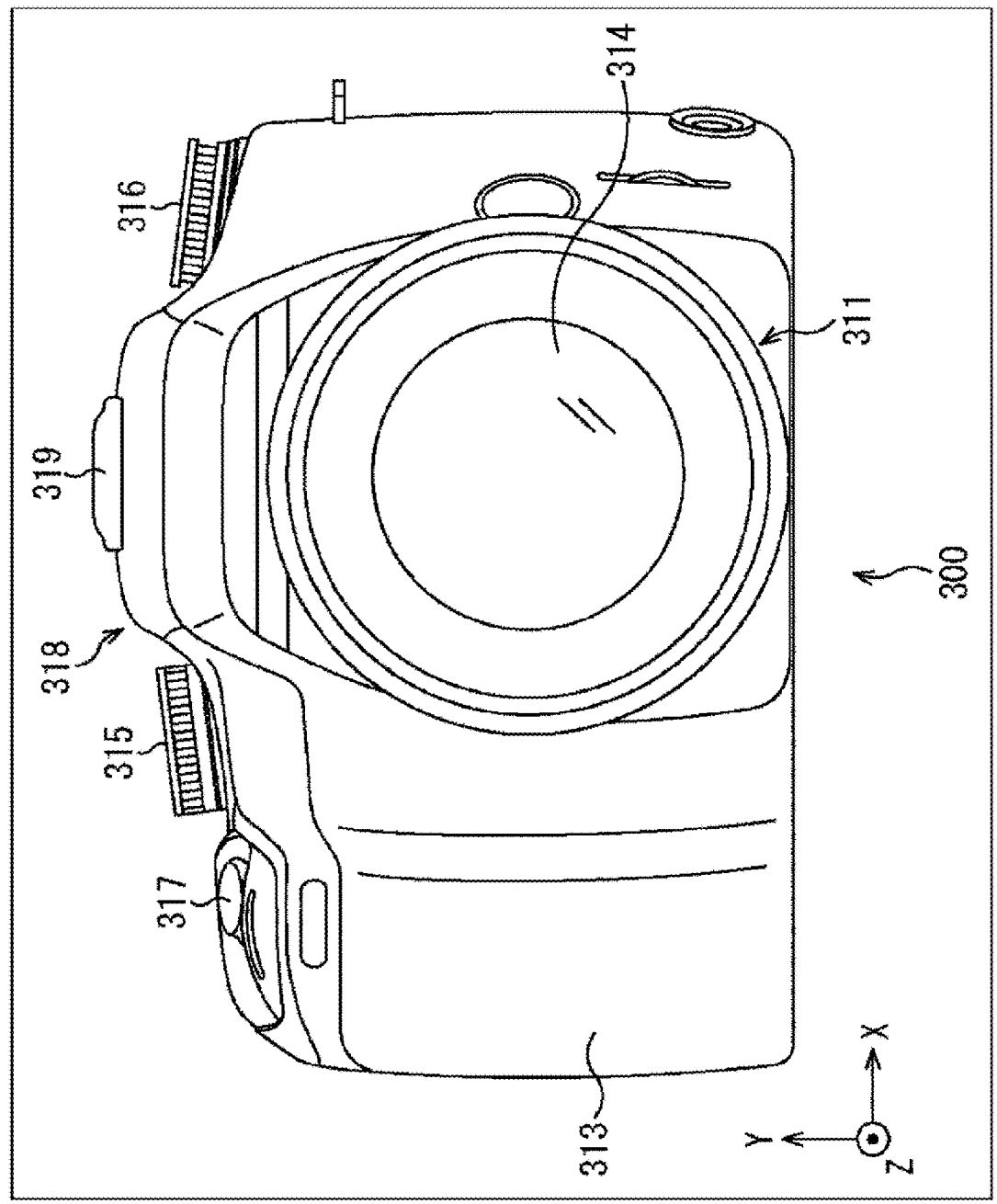
FIG. 23 is a diagram illustrating a configuration example of outer appearance of a high-performance camera according to an embodiment of the present technology.

In addition, the solid-state imaging device according to an embodiment of the present technology can be incorporated into a high-performance camera (single-lens-reflex camera) 300 as illustrated in FIG. 23.

In the example of FIG. 23, a configuration example of outer appearance of the high-performance camera 300 is illustrated. The high-performance camera 300 is configured to include a lens barrel 311, a housing 313, a lens 314, adjustment dials 315 and 316 for aperture and zoom, a shutter button 317, a finder 318, and a flash 319. Inside the high-performance camera 300, an imaging device (not illustrated) is installed at a position where light from the lens 314 is received. As the imaging device, the solid-state imaging device 1 according to the first embodiment of the present technology is installed. Therefore, it is possible to improve image quality of the high-performance camera 300.

By applying the present technology, in a medical apparatus (a health care instrument, a capsule endoscope, a DNA chip, or the like) illustrated in FIG. 24, it is possible to improve image quality.

The capsule endoscope 400 illustrated in FIG. 24 is a small-sized device imaging a state inside a human body of a test person who swallows the capsule endoscope. The capsule endoscope 400 includes a built-in imaging apparatus 401.

As the imaging apparatus of the above-described apparatus, an imaging apparatus 100 (FIG. 21) according to an embodiment of the present technology is used, so that it is possible to acquire wavelength dependency while maintaining high resolution. By acquiring the wavelength dependency, the apparatus can be used for health care, pathological analysis such as hemoglobin analysis described above.

In addition, with respect to an optical characteristic analysis for molecules or DNA of which molecular size falls into a size of a single pixel, in the present technology capable of obtaining a plurality of optical characteristics by using one pixel, it is possible to more accurately acquire the optical characteristics (it is possible to perform multiple-spectroscopy on the same molecule by using the same pixel).

In addition, in this specification, the steps describing a series of the above-described processes includes processes performed in time series according to the order disclosed and processes which are not necessarily performed in time series but performed in parallel or individually.

In addition, the embodiments according to an embodiment of the present disclosure are not limited to the above-described embodiments, but various changes are available within the scope without departing from the spirit of the present disclosure.

In addition, heretofore, a configuration described as one apparatus (or processing unit) may be divided to configure a plurality of apparatuses (or processing units). On the contrary, heretofore, configurations described as a plurality of apparatuses (processing units) may be collected to configure one apparatus (or processing unit). In addition, a configuration other than the above-described configurations may be added to each apparatus (or each processing unit). In addition, if configurations or operations are substantially the same in terms of the entire system, a portion of configuration of an apparatus (or processing unit) may be allowed to be included in a configuration of other apparatus (or other processing unit). The present technology is not limited to the above-described embodiments, but various changes are available within the scope without departing from the spirit of the present technology.

Herein, although exemplary embodiments of the present disclosure are described in detail with reference to the attached drawings, the disclosure is not limited to the embodiments. It should be noted that, it is obvious that the skilled in the art which the present disclosure belongs to can contrive various changes or modifications within the scope disclosed in the claims, and these changes and modifications are also included within the scope of the present disclosure.

In addition, the present technology may have the configurations as follows.

(1)

A solid-state imaging device may comprise a plurality of photoelectric conversion members including a first photoelectric conversion member and a second photoelectric conversion member configured to perform photoelectric conversion; and a light-reflecting portion including a first portion having a first opening formed therein, the first portion being arranged to perform light reducing or light shielding of light incident on the first photoelectric conversion member; and a second portion having a second opening formed therein, the second portion being arranged to perform light reducing or light shielding of light incident on the second photoelectric conversion member, wherein the first opening has a first shape, wherein the second opening has a second shape different than the first shape, and wherein neither the first photoelectric conversion member nor the second photoelectric conversion member is included as a portion of a phase-difference pixel.

Each of the first shape and the second shape may have a same number of sides.

A ratio of lengths of the sides of the first shape and a ratio of lengths of the sides of the second shape may be different.

An aperture ratio of the first opening and aperture ratio of the second opening may be the same or different.

The first shape and/or the second shape may be a non-linear shape.

The light-reflecting portion may have formed therein an opening arranged over each of the plurality of photoelectric conversion members, and wherein a ratio of lengths of sides of the opening may be different for each photoelectric conversion member under which the opening is arranged.

The solid-state imaging device according may further comprise a color filter formed over each of the plurality of photoelectric conversion members, wherein the ratio of lengths of sides of the opening is dependent on a color of color filters for photoelectric conversion members adjacent to the photoelectric conversion member under which the opening is arranged.

The solid-state imaging device may further comprise a plurality of on-chip lenses, each of which is formed over a corresponding one of the plurality of photoelectric conversion members, wherein the light-reflecting portion is arranged between the on-chip lenses and the plurality of photoelectric conversion members.

The plurality of on-chip lenses may be formed so as to correspond to the plurality of the photoelectric conversion members.

The light-reflecting portion may comprise a metal film configured to perform the light reducing.

The light-reflecting portion may comprise color filters for a plurality of colors, wherein the color filters are configured to perform the light reducing.

The light-reflecting portion may comprise a metal film and color filters for a plurality of colors, wherein the light-reflecting portion is configured to perform a combination of light reducing by using the metal film and the color filters.

The plurality of photoelectric conversion members may comprise a photodiode or an organic photoelectric conversion film.

The first photoelectric conversion member and the second photoelectric conversion member may be adjacent and associated with color filters of a same color.

The plurality of photoelectric conversion elements includes a third photoelectric conversion member configured to perform image-plane phase difference detection, and wherein the light-reflecting portion may have formed therein openings arranged over photoelectric conversion members surrounding the third photoelectric conversion member, wherein a shape of the openings arranged over the photoelectric conversion member surrounding the third photoelectric conversion member are different from each other.

(2)

An electronic apparatus may comprise a solid-state imaging comprising: a plurality of photoelectric conversion members including a first photoelectric conversion member and a second photoelectric conversion member configured to perform photoelectric conversion; a light-reflecting portion including: a first portion having a first opening formed therein, the first portion being arranged to perform light reducing or light shielding of light incident on the first photoelectric conversion member; and a second portion having a second opening formed therein, the second portion being arranged to perform light reducing or light shielding of light incident on the second photoelectric conversion member, wherein the first opening has a first shape, wherein the second opening has a second shape different than the first shape, and wherein neither the first photoelectric conversion member nor the second photoelectric conversion member is included as a portion of a phase-difference pixel; a signal processing circuit configured to process an output signal output from the solid-state imaging device; and an optical system configured to focus incident light on the solid-state imaging device.

(3)

A solid-state imaging device may comprise a first light receiving area and a second light receiving area, each of which is configured to perform photoelectric conversion, wherein the first light receiving area has a first shape and the second light receiving area has a second shape different from the first shape, and wherein neither the first light receiving area nor the second light receiving area is included as a portion of a phase-difference pixel; and a light-reflecting portion including: a first portion having a first opening formed therein, the first portion being arranged to perform light reducing or light shielding of light incident on the first light receiving area; and a second portion having a second opening formed therein, the second portion being arranged to perform light reducing or light shielding of light incident on the second light receiving area.

(4)

A solid-state imaging device may comprise a plurality of photoelectric conversion members being configured to perform photoelectric conversion, the plurality of photoelectric conversion members including a first photoelectric conversion member and a second photoelectric conversion member adjacent to the first photoelectric conversion member; and a light-reflecting portion including: a first portion having a first opening formed therein, the first portion being arrange to perform light reducing or light shielding of light incident on the first photoelectric conversion member; and a second portion having a second opening formed therein, the second portion being arranged to perform light reducing or light shielding of light incident on the second photoelectric conversion member, wherein the first opening has a first shape, wherein the second opening has a second shape different than the first shape, and wherein the first photoelectric conversion member and the second photoelectric conversion member are arranged to receive light through a same on-chip lens.

REFERENCE SIGNS LIST

1 Solid-state imaging device
2, 2-1 to 2-3 Pixel
3 Pixel area (imaging area)
31-1 to 31-3, 31-1R to 31-3R, 31-1L to 31-3L Photodiode
32, 32-1 to 32-3 Light-shielding film
33-1 to 33-3 Color filter
34 On-chip lens
35, 35-1 to 35-4 Opening
100 Imaging apparatus
102 Imaging device
200 Mobile communication terminal
201 Imaging device
300 High-performance camera
400 Capsule endoscope

The invention claimed is:

1. A solid-state imaging device, comprising:
a plurality of photoelectric conversion members including a first photoelectric conversion member and a second photoelectric conversion member configured to perform photoelectric conversion; and
a light-reflecting portion including:
a first portion having a first opening formed therein, the first portion being arranged to perform light reducing or light shielding of light incident on the first photoelectric conversion member; and
a second portion having a second opening formed therein, the second portion being arranged to perform light reducing or light shielding of light incident on the second photoelectric conversion member, wherein the first opening has a first shape,
wherein the second opening has a second shape different than the first shape,
wherein an aperture ratio of the first opening and an aperture ratio the second opening are different, and
wherein neither the first photoelectric conversion member nor the second photoelectric conversion member is included as a portion of a phase-difference pixel.

2. The solid-state imaging device according to claim 1, wherein each of the first shape and the second shape has a same number of sides.

3. The solid-state imaging device according to claim 2, wherein a ratio of lengths of the sides of the first shape and a ratio of lengths of the sides of the second shape are different.

4. The solid-state imaging device according to claim 1, wherein the first shape and/or the second shape is a non-linear shape.

5. The solid-state imaging device according to claim 1, wherein the light-reflecting portion has formed therein an opening arranged over each of the plurality of photoelectric conversion members, and wherein a ratio of lengths of sides of the opening is different for each photoelectric conversion member under which the opening is arranged.

6. The solid-state imaging device according to claim 5, further comprising a color filter formed over each of the plurality of photoelectric conversion members, wherein the ratio of lengths of sides of the opening is dependent on a color of color filters for photoelectric conversion members adjacent to the photoelectric conversion member under which the opening is arranged.

7. The solid-state imaging device according to claim 1, further comprising a plurality of on-chip lenses, each of which is formed over a corresponding one of the plurality of photoelectric conversion members, wherein the light-reflecting portion is arranged between the on-chip lenses and the plurality of photoelectric conversion members.

8. The solid-state imaging device according to claim 7, wherein the plurality of on-chip lenses are formed so as to correspond to the plurality of the photoelectric conversion members.

9. The solid-state imaging device according to claim 1, wherein the light-reflecting portion comprises a metal film configured to perform the light reducing.

10. The solid-state imaging device according to claim 1, wherein the light-reflecting portion comprises color filters for a plurality of colors, wherein the color filters are configured to perform the light reducing.

11. The solid-state imaging device according to claim 1, wherein the light-reflecting portion comprises a metal film and color filters for a plurality of colors, wherein the light-reflecting portion is configured to perform a combination of light reducing by using the metal film and the color filters.

12. The solid-state imaging device according to claim 1, wherein the plurality of photoelectric conversion members comprise a photodiode or an organic photoelectric conversion film.

13. The solid-state imaging device according to claim 1, wherein the first photoelectric conversion member and the second photoelectric conversion member are adjacent and are associated with color filters of a same color.

14. The solid-state imaging device according to claim 1, wherein the plurality of photoelectric conversion elements includes a third photoelectric conversion member configured to perform image-plane phase difference detection, and
wherein the light-reflecting portion has formed therein openings arranged over photoelectric conversion members surrounding the third photoelectric conversion member, wherein a shape of the openings arranged over the photoelectric conversion member surrounding the third photoelectric conversion member are different from each other.

15. An electronic apparatus, comprising:
a solid-state imaging comprising:
a plurality of photoelectric conversion members including a first photoelectric conversion member and a second photoelectric conversion member configured to perform photoelectric conversion; a light-reflecting portion including:
a first portion having a first opening formed therein, the first portion being arranged to perform light reducing or light shielding of light incident on the first photoelectric conversion member; and
a second portion having a second opening formed therein, the second portion being arranged to perform light reducing or light shielding of light incident on the second photoelectric conversion member,
wherein the first opening has a first shape,
wherein the second opening has a second shape different than the first shape,
wherein an aperture ratio of the first opening and an aperture ratio the second opening are different, and
wherein neither the first photoelectric conversion member nor the second photoelectric conversion member is included as a portion of a phase-difference pixel;
a signal processing circuit configured to process an output signal output from the solid-state imaging device; and
an optical system configured to focus incident light on the solid-state imaging device.

16. A solid-state imaging device, comprising:
a first light receiving area and a second light receiving area, each of which is configured to perform photoelectric conversion,
wherein the first light receiving area has a first shape and the second light receiving area has a second shape different from the first shape,
wherein an aperture ratio of the first opening and an aperture ratio the second opening are different, and
wherein neither the first light receiving area nor the second light receiving area is included as a portion of a phase-difference pixel; and
a light-reflecting portion including:
a first portion having a first opening formed therein, the first portion being arranged to perform light reducing or light shielding of light incident on the first light receiving area; and
a second portion having a second opening formed therein, the second portion being arranged to perform light reducing or light shielding of light incident on the second light receiving area.

17. The solid-state imaging device according to claim 16, wherein each of the first shape and the second shape has a same number of sides.

18. The solid-state imaging device according to claim 17, wherein a ratio of lengths of the sides of the first shape and a ratio of lengths of the sides of the second shape are different.

19. The solid-state imaging device according to claim 16, wherein the first shape and/or the second shape is a non-linear shape.

20. The solid-state imaging device according to claim 16, further comprising a plurality of on-chip lenses each of which is formed over a light receiving area, wherein the light-reflecting portion is arranged between the plurality of on-chip lenses and the light receiving areas including the first light receiving area and the second light receiving area.

21. The solid-state imaging device according to claim 16, wherein the light-reflecting portion comprises a metal film configured to perform the light reducing.

22. The solid-state imaging device according to claim 16, wherein the light-reflecting portion comprises color filters for a plurality of colors, wherein the color filters are configured to perform the light reducing.

23. The solid-state imaging device according to claim 16, wherein the light-reflecting portion comprises a metal film and color filters for a plurality of colors, wherein the light-reflecting portion is configured to perform a combination of light reducing by using the metal film and the color filters.

24. The solid-state imaging device according to claim 16, wherein the first light receiving area and the second light receiving area are adjacent and are associated with color filters of a same color.

25. A solid-state imaging device, comprising:
a plurality of photoelectric conversion members being configured to perform photoelectric conversion, the plurality of photoelectric conversion members including a first photoelectric conversion member and a second photoelectric conversion member adjacent to the first photoelectric conversion member; and
a light-reflecting portion including:
a first portion having a first opening formed therein, the first portion being arranged to perform light reducing or light shielding of light incident on the first photoelectric conversion member; and
a second portion having a second opening formed therein, the second portion being arranged to perform light reducing or light shielding of light incident on the second photoelectric conversion member, wherein the first opening has a first shape, wherein the second opening has a second shape different than the first shape, wherein an aperture ratio of the first opening and an aperture ratio the second opening are different, and wherein the first photoelectric conversion member and the second photoelectric conversion member are arranged to receive light through a same on-chip lens.

26. The solid-state imaging device according to claim 25, wherein each of the first shape and the second shape has a same number of sides.

27. The solid-state imaging device according to claim 26, wherein a ratio of lengths of the sides of the first shape and a ratio of lengths of the sides of the second shape are different.

28. The solid-state imaging device according to claim 25, wherein the first shape and/or the second shape is a non-linear shape.

29. The solid-state imaging device according to claim 25, wherein the light-reflecting portion has formed therein an opening arranged over each of the plurality of photoelectric conversion members, and wherein a ratio of lengths of sides of the opening is different for each photoelectric conversion member under which the opening is arranged.

30. The solid-state imaging device according to claim 29, further comprising a color filter formed over each of the plurality of photoelectric conversion members, wherein the ratio of lengths of sides of the opening is dependent on a color of color filters for photoelectric conversion members adjacent to the photoelectric conversion member under which the opening is arranged.

31. The solid-state imaging device according to claim 25, wherein the light-reflecting portion comprises a metal film configured to perform the light reducing.

32. The solid-state imaging device according to claim 25, wherein the light-reflecting portion comprises color filters for a plurality of colors, wherein the color filters are configured to perform the light reducing.

33. The solid-state imaging device according to claim 25, wherein the light-reflecting portion comprises a metal film and color filters for a plurality of colors, wherein the light-reflecting portion is configured to perform a combination of light reducing by using the metal film and the color filters.

34. The solid-state imaging device according to claim 25, wherein the plurality of photoelectric conversion members comprise a photodiode or an organic photoelectric conversion film.

35. The solid-state imaging device according to claim 25, wherein the first photoelectric conversion member and the second photoelectric conversion member are adjacent and are associated with color filters of a same color.

36. The solid-state imaging device according to claim 25, wherein the plurality of photoelectric conversion elements includes a third photoelectric conversion member configured to perform image-plane phase difference detection, and wherein the light-reflecting portion has formed therein openings arranged over photoelectric conversion members surrounding the third photoelectric conversion member, wherein a shape of the openings arranged over the photoelectric conversion member surrounding the third photoelectric conversion member are different from each other.

* * * * *